United States Patent
Nojiri et al.

(10) Patent No.: US 8,455,346 B2
(45) Date of Patent: Jun. 4, 2013

(54) METHOD FOR MANUFACTURING NONVOLATILE MEMORY DEVICE

(75) Inventors: Yasuhiro Nojiri, Mie-ken (JP); Hiroyuki Fukumizu, Mie-ken (JP); Shinichi Nakao, Kanagawa-ken (JP); Kei Watanabe, Tokyo (JP); Kazuhiko Yamamoto, Kanagawa-ken (JP); Ichiro Mizushima, Kanagawa-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 13/075,658

(22) Filed: Mar. 30, 2011

(65) Prior Publication Data

US 2011/0306199 A1    Dec. 15, 2011

(30) Foreign Application Priority Data

Jun. 10, 2010 (JP) ................................. 2010-133411
Feb. 23, 2011 (JP) ................................. 2011-37238

(51) Int. Cl.
*H01L 21/4763* (2006.01)
*G11C 11/00* (2006.01)

(52) U.S. Cl.
USPC ........... 438/618; 365/148; 438/478; 438/502; 257/E21.101; 257/E21.375

(58) Field of Classification Search
USPC ... 438/618, 478, 502; 365/148; 257/E21.101, 257/E21.375
See application file for complete search history.

(56) References Cited

U.S. PATENT DOCUMENTS

| | | | |
|---|---|---|---|
| 8,264,866 B2* | 9/2012 | Fukumizu et al. | 365/148 |
| 2007/0158697 A1* | 7/2007 | Choi et al. | 257/246 |
| 2007/0184647 A1* | 8/2007 | Furukawa et al. | 438/622 |
| 2009/0168491 A1* | 7/2009 | Schricker et al. | 365/148 |
| 2010/0102324 A1* | 4/2010 | Toguchi et al. | 257/66 |
| 2010/0108981 A1* | 5/2010 | Jayasekara | 257/5 |
| 2011/0049463 A1* | 3/2011 | Yamamoto et al. | 257/4 |
| 2011/0069525 A1 | 3/2011 | Fukumizu et al. | |
| 2011/0215320 A1* | 9/2011 | Chan et al. | 257/49 |

FOREIGN PATENT DOCUMENTS

JP    2008-235637    10/2008

OTHER PUBLICATIONS

Franz Kreupl et al., "Carbon-Based Resistive Memory," IEEE, 2008, pp. 521-524.

* cited by examiner

*Primary Examiner* — Leonard Chang
(74) *Attorney, Agent, or Firm* — Oblon, Spivak, McClelland, Maier & Neustadt, L.L.P.

(57) ABSTRACT

According to one embodiment, a method is disclosed for manufacturing a nonvolatile memory device. The nonvolatile memory device includes a memory cell connected to a first interconnect and a second interconnect. The method can include forming a first electrode film on the first interconnect. The method can include forming a layer including a plurality of carbon nanotubes dispersed inside an insulator on the first electrode film. At least one carbon nanotube of the plurality of carbon nanotubes is exposed from a surface of the insulator. The method can include forming a second electrode film on the layer. In addition, the method can include forming a second interconnect on the second electrode film.

34 Claims, 17 Drawing Sheets

SHORTS OCCUR

METHOD FOR MANUFACTURING NONVOLATILE MEMORY DEVICE

CROSS-REFERENCE TO RELATED APPLICATIONS

This application is based upon and claims the benefit of priority from the prior Japanese Patent Application No. 2010-133411, filed on Jun. 10, 2010 and the prior Japanese Patent Application No. 2011-037238, filed on Feb. 23, 2011; the entire contents of which are incorporated herein by reference.

FIELD

Embodiments described herein relate generally to a method for manufacturing a nonvolatile memory device.

BACKGROUND

Nonvolatile memory typified by NAND flash memory is widely used for large-capacity data memory in mobile telephones, digital still cameras, USB (Universal Serial Bus) memory, silicon audio, etc. New applications are rapidly being developed; and it is desirable to downscale and reduce manufacturing costs. In particular, in NAND flash memory, multiple active areas ("A.A.") share gate conductors ("G.C."). NAND flash memory utilizes a transistor operation to store information by a threshold shift; and it is said that there are limitations on increasing the uniformity of the characteristics, the reliability, the operation speed, and the bit density.

Conversely, for example, in a phase change memory element or a resistance change memory element, the transistor operation is unnecessary in the programming/erasing operations because variable resistance states of a resistive material are utilized. Thereby, further increases of the uniformity of the characteristics, the reliability, the operation speed, and the bit density are expected.

DETAILED DESCRIPTION

In general, according to one embodiment, a method is disclosed for manufacturing a nonvolatile memory device. The nonvolatile memory device includes a memory cell connected to a first interconnect and a second interconnect. The method can include forming a first electrode film on the first interconnect. The method can include forming a layer including a plurality of carbon nanotubes dispersed inside an insulator on the first electrode film. At least one carbon nanotube of the plurality of carbon nanotubes is exposed from a surface of the insulator. The method can include forming a second electrode film on the layer. In addition, the method can include forming a second interconnect on the second electrode film.

The embodiment will now be described with reference to the drawings.

First Embodiment

First, prior to describing a method for manufacturing a nonvolatile memory device, the structure and the operations of a memory cell portion of the nonvolatile memory device will be described.

FIGS. 1A to 2C are schematic views of main components of the memory cell portions of the nonvolatile memory device according to the first embodiment.

Figure 1A:
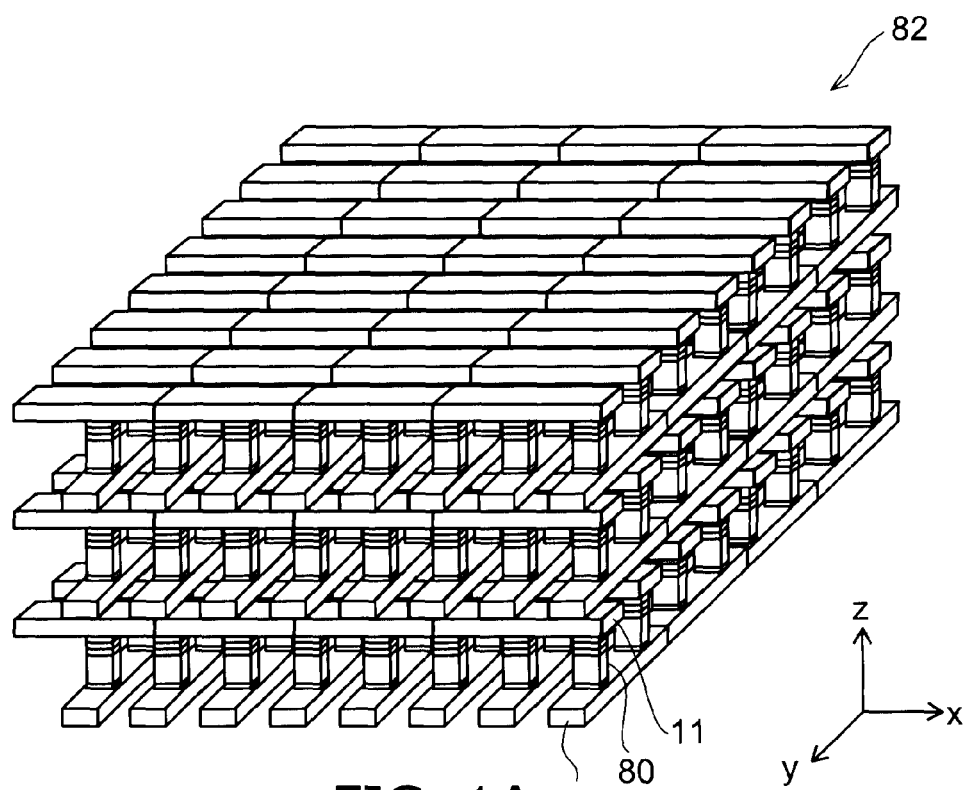
FIGS. 1A and 1B are schematic views of main components of a memory cell portion of a nonvolatile memory device according to a first embodiment.
Figure 1B:
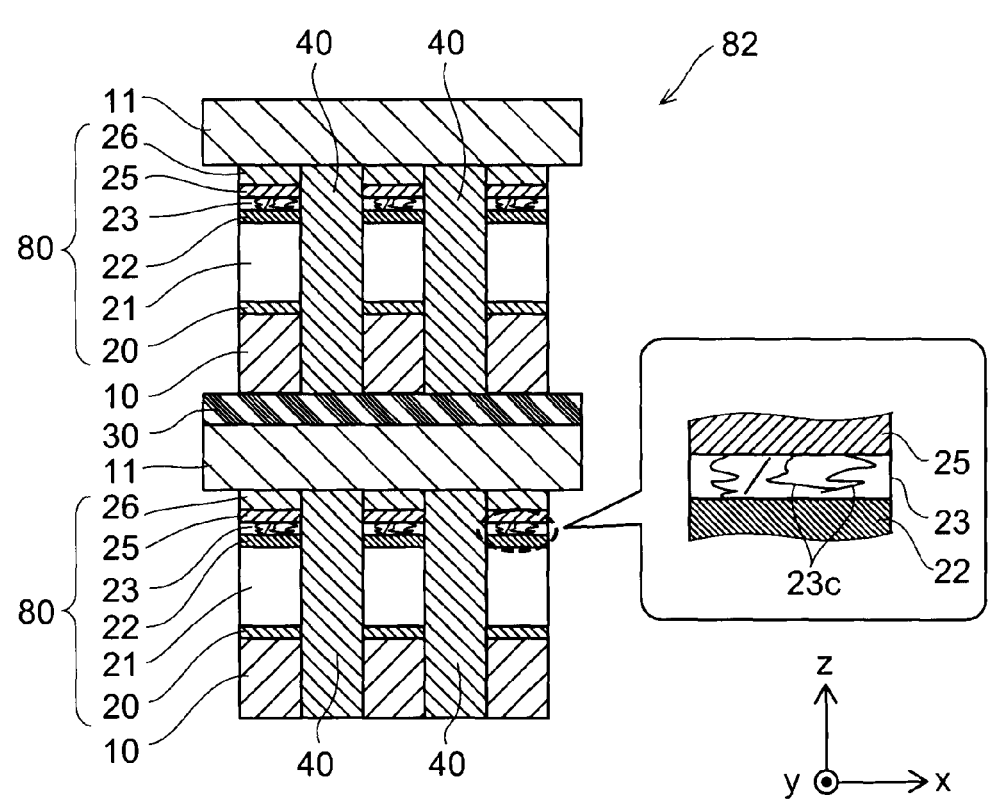

First, the memory cell portion of the nonvolatile memory device will be described using FIGS. 1A and 1B. FIG. 1A is a schematic three-dimensional view of main components of the memory cell portion. FIG. 1B is a cross-sectional view of a memory cell (a unit cell component) 80 provided at the position where a lower interconnect (a bit line: BL) 10 and an upper interconnect (a word line: WL) 11 of FIG. 1A cross. A memory unit 82 of the nonvolatile memory device has a cross-point ReRAM (Resistance Random Access Memory) cell array structure.

In the memory unit 82 of the nonvolatile memory device, the lower interconnect 10 (the first interconnect) and the upper interconnect 11 (the second interconnect) are provided; and the memory cell 80 is interposed between the lower interconnect 10 (the first interconnect) and the upper interconnect 11 (the second interconnect). The upper interconnect 11 extends in the first direction (the X-axis direction of the drawings) and is disposed periodically in the second direction (the Y-axis direction of the drawings). The lower interconnect 10 extends in the second direction (the Y-axis direction of the drawings) non-parallel to the first direction and is disposed periodically in the first direction. In other words, the memory cell 80 exists between (at the cross-point positions of) the lower interconnect 10 and the upper interconnect 11 that cross each other. The memory density can be increased by stacking the lower interconnect 10, the upper interconnect 11, and the memory cell 80 in the Z-axis direction of the drawings.

As illustrated in FIG. 1B, the lower interconnect 10 of the memory cell 80 is used as a foundation. A metal film 20, a diode layer 21, a metal film 22 (a first electrode film), a carbon nanotube-including layer (hereinbelow referred to as the CNT-containing layer) 23, and a metal film 25 (a second electrode film) are provided from the lower layer toward the upper layer. The CNT-containing layer 23 functions as the resistance varing layer. In the case where the CNT-containing layer 23 is used as the memory layer, a switching operation faster than that of a nonvolatile memory device including an oxide film (e.g., manganese oxide) as the memory layer can be obtained. A stopper interconnect film 26 for CMP (Chemical Mechanical Polishing) is provided on the metal film 25.

The metal films 20 of the memory cells 80 are connected to each other by the lower interconnect 10; and the stopper interconnect films 26 of the memory cells 80 are connected to each other by the upper interconnect 11. The diode layer 21 and the CNT-containing layer 23 are connected in series in each of the memory cells 80; and a current flows in one direction in each of the memory cells 80. In the memory unit 82, an inter-layer insulating film 30 is interposed between the upper interconnect 11 and the lower interconnect 10.

Thus, the memory unit 82 has a structure in which a set including the lower interconnect 10, the memory cell 80, and the upper interconnect 11 is stacked in multiple levels. An element-separating layer 40 is provided between the adjacent memory cells 80 to ensure insulation between the memory cells 80. However, the embodiment is not limited to this specific example. For example, a nonvolatile memory device including only one set without the set including the lower interconnect 10, the memory cell 80, and the upper interconnect 11 being stacked in multiple levels also is included in the scope of the embodiment.

The width of the memory cell 80 is not more than 100 nm. Unless otherwise specified in the embodiment, "width" may refer to the diameter of the cross-section of a portion when the portion is cut substantially perpendicular to the Z-axis direction.

When a voltage is applied to the lower interconnect 10 and the upper interconnect 11 of such a memory unit 82 and the desired current flows inside the CNT-containing layer 23, the CNT-containing layer 23 transitions reversibly between the first state and the second state. For example, the voltage applied between the major surfaces of the CNT-containing layer 23 changes; and the resistance value of the CNT-containing layer 23 changes reversibly between the first state and the second state. Thereby, it is possible to store digital information ("0," "1,", etc.) in the memory cell 80 and erase the digital information from the memory cell 80. The programming from "0" to "1" is referred to as a set operation; and the programming of "1" to "0" is referred to as a reset operation.

For example, the high resistance state of the CNT-containing layer 23 is taken as "0;" and the low resistance state of the CNT-containing layer 23 is taken as "1."

Figure 2A:
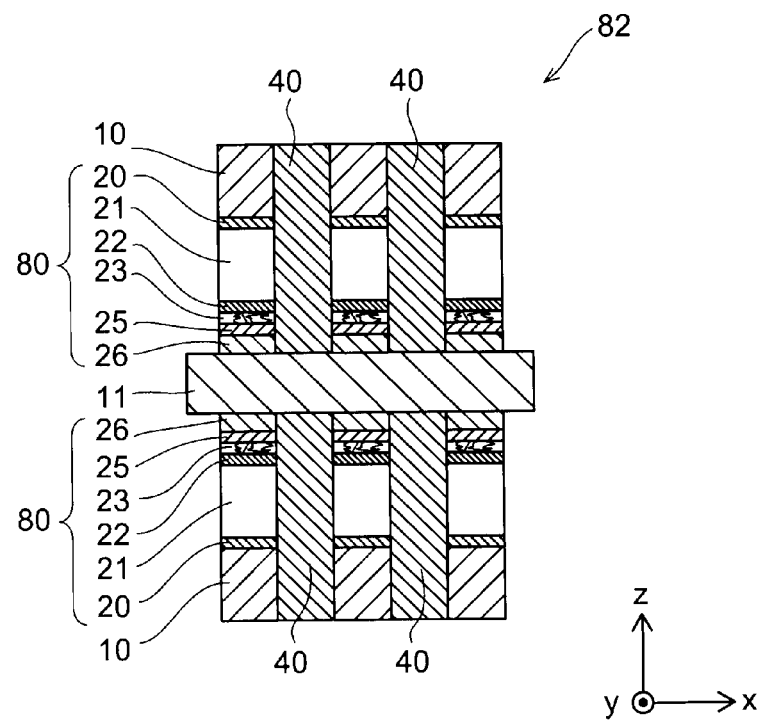
FIGS. 2A to 2C are schematic views of main components of the memory cell portion of the nonvolatile memory device according to the first embodiment.

The memory unit 82 may have the structure illustrated in FIG. 2A instead of the ReRAM cell array structure illustrated in FIG. 1A.

In the ReRAM memory cell array illustrated in FIG. 2A, the memory cell 80 is disposed on and under the upper interconnect 11, which is the word line, by using a common upper interconnect 11 instead of providing the upper interconnect 11 for each of the levels.

For example, the memory cell 80 below the upper interconnect 11 and the memory cell 80 above the upper interconnect 11 may be disposed symmetrically with the illustrated upper interconnect 11 as the axis of symmetry.

According to such a structure, besides increasing the memory density, the voltage application delay to the upper interconnect 11 can be suppressed, the speeds of the programming operation and the erasing operation can be increased, the element surface area can be reduced, etc., by using the common upper interconnect 11.

Thus, the nonvolatile memory device of the embodiment includes the upper interconnect 11 extending in the X-axis direction, the lower interconnect 10 extending in the Y-axis direction non-parallel to the X-axis direction, and the memory cell 80 provided at the position where the lower interconnect 10 intersects the upper interconnect 11. The memory cell 80 is made of the multiple stacked films; and the stacked films include the CNT-containing layer 23.

Figure 2B:
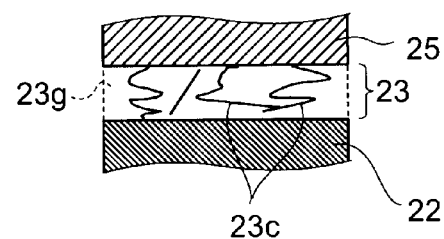
Figure 2C:
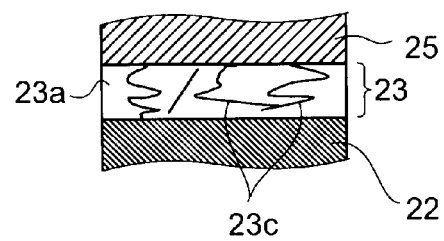

The CNT-containing layer 23 inside the memory cell 80 will now be described in more detail. FIG. 2B and FIG. 2C are enlarged views of the CNT-containing layer 23.

First, the CNT-containing layer 23 illustrated in FIG. 2B includes multiple CNTs 23c dispersed in a gap 23g between the metal film 22 and the metal film 25. The gap 23g is hollow.

The CNT-containing layer 23 illustrated in FIG. 2C includes an insulator 23a disposed around the CNTs 23c without the gap 23g being provided. In other words, the insulator 23a is disposed between the metal film 22 and the metal film 25.

In the embodiment, the so-called CNT-containing layer 23 includes the multiple CNTs 23c and the gap 23g. Or, the so-called CNT-containing layer 23 includes the multiple CNTs 23c and the insulator 23a. In the CNT-containing layer 23, one end of at least one carbon nanotube 23c of the multiple carbon nanotubes 23c contacts the metal film 22; and one other end is electrically connected to the metal film 25.

The form in which a bent portion of the carbon nanotube 23c contacts the metal film 22 or the metal film 25 is included in the embodiment. Restated, in the CNT-containing layer 23, one portion of at least one carbon nanotube 23c of the multiple carbon nanotubes 23c contacts the metal film 22; and a portion other than the one portion is electrically connected to the metal film 25. Such a form also is included in the embodiment.

The CNT 23c may be a single-walled nanotube (SWNT) having a single layer or a multi-walled nanotube (MWNT) having multiple layers. In the case of a SWNT, the diameter of the CNT 23c is about 2 nm.

An oxide such as silicon oxide ($SiO_2$), alumina ($Al_2O_3$), silicon oxide-carbon (SiOC), magnesium oxide (MgO), etc., an organic insulator such as a resist, etc., may be used as the insulator 23a. The insulator 23a may be a high-k material or a low-k material. At least a portion of the insulator 23a may be in a fine-particle state. Or, the insulator 23a may be polymethylsilsesquioxane (PMSQ).

Tungsten (W), for example, which has a low resistivity and excellent thermal tolerance to high temperatures, may be used as the material of the lower interconnect 10, the upper interconnect 11, and the stopper interconnect film 26. Or, tungsten nitride (WN), tungsten carbide (WC), titanium (Ti), titanium nitride (TiN), etc., may be used.

For example, titanium (Ti), titanium nitride (TiN), tungsten (W), tungsten nitride (WN), platinum (Pt), etc., may be used as the material of the metal films 20, 22, and 25.

For example, a rectifying element such as a PIN diode, a PN junction diode, a Schottky diode, a Zener diode, etc., having polysilicon (poly-Si) as the main component may be used as the diode layer 21. Other than silicon, a semiconductor material such as germanium (Ge), etc., a semiconductor material combined with a metal oxide such as NiO, TiO, CuO, InZnO, etc., may be used as the material of the diode layer 21.

Layers having components different from those of the metal films 20 and 22 may be provided at the interfaces between the diode layer 21 and the metal films 20 and 22 to ensure a stable ohmic contact between the diode layer 21 and the metal films 20 and 22. Such a layer may include, for example, a metal silicide layer. The metal silicide layer may be formed by annealing the metal films 20 and 22 and the diode layer 21.

The material of the element-separating layer 40 may include silicon oxide ($SiO_2$), FSG (SiOF), BSG ($SiO_2$—$B_2O_3$, SiOB), HSQ (Si—H-containing $SiO_2$), porous silica, carbon-containing porous silica, carbon-containing $SiO_2$ (SiOC), silicon nitride ($Si_3N_4$), aluminum nitride (AlN), alumina ($Al_2O_3$), silicon oxynitride (SiON), hafnia ($HfO_2$), MSQ (methyl group-containing $SiO_2$), porous MSQ, polyimide-based polymer resin, parylene-based polymer resin, Teflon (registered trademark)-based polymer resin, amorphous carbon, fluorine-containing amorphous carbon, etc.

The element-separating layer 40 may have a density higher than that of the insulator 23a. For example, an element-separating layer 40 including silicon (Si) may be formed by CVD using a high-density plasma to provide a density higher than that of the insulator 23a. Or, baking and the like may be performed to provide a density higher than that of the insulator 23a in the case where the element-separating layer 40 is formed by coating.

The structure of the CNT-containing layer 23 illustrated in the drawings is illustrated schematically; and the density of the actual CNTs 23c is different from that illustrated. The actual CNT-containing layer 23 includes many more of the CNTs 23c than illustrated.

Manufacturing processes of the memory cell 80 will now be described.

FIG. 3A to FIG. 10B illustrate the manufacturing processes of the memory cell according to the first embodiment.

Figure 3A:
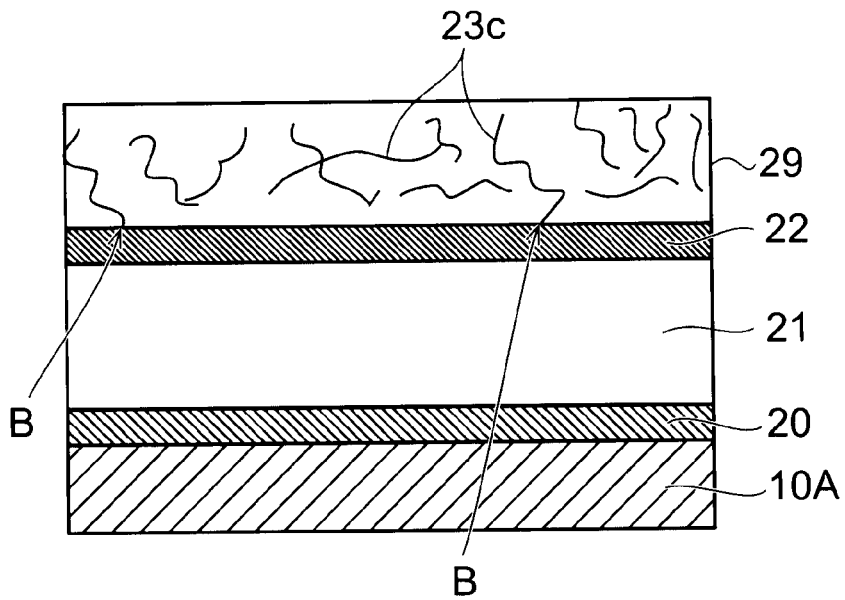
FIGS. 3A and 3B illustrate manufacturing processes of the memory cell portion of the nonvolatile memory device according to the first embodiment.
Figure 3A:
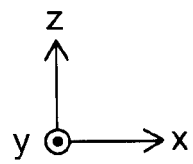

First, a stacked body having the same stacked configuration as the memory cell 80 is formed. For example, as illustrated in FIG. 3A, a lower interconnect layer 10A having a planar configuration (a spread configuration) is formed on the upper layer of a semiconductor substrate (not illustrated) having a main component of silicon (Si), gallium arsenide (GaAs), etc. Continuing, a stacked film of the metal film 20/the diode layer 21/the metal film 22 is formed in this order on the lower interconnect layer 10A. The lower interconnect layer 10A/the metal film 20/the diode layer 21/the metal film 22 are formed, for example, by sputtering or CVD.

Then, the solution in which the CNTs 23c are dispersed is coated onto the metal film 22. The coating is performed by spin coating. The solvent of the solution in which the CNTs 23c are dispersed is water, an organic solvent (e.g., ethanol), etc. Thereby, a coated film 29 including the CNTs 23c is formed on the metal film 22. In the coated film 29, one end of one of the CNTs 23c contacts the metal film 22. FIG. 3A illustrates the state in which the one end of the CNT 23c contacts the metal film 22 at a portion B. The portion of the CNT 23c that contacts the metal film 22 may be a portion of the CNT 23c other than the one end recited above. In other words, a portion of the CNT 23c contacts the metal film 22. This is similar for the other embodiments.

Figure 3B:
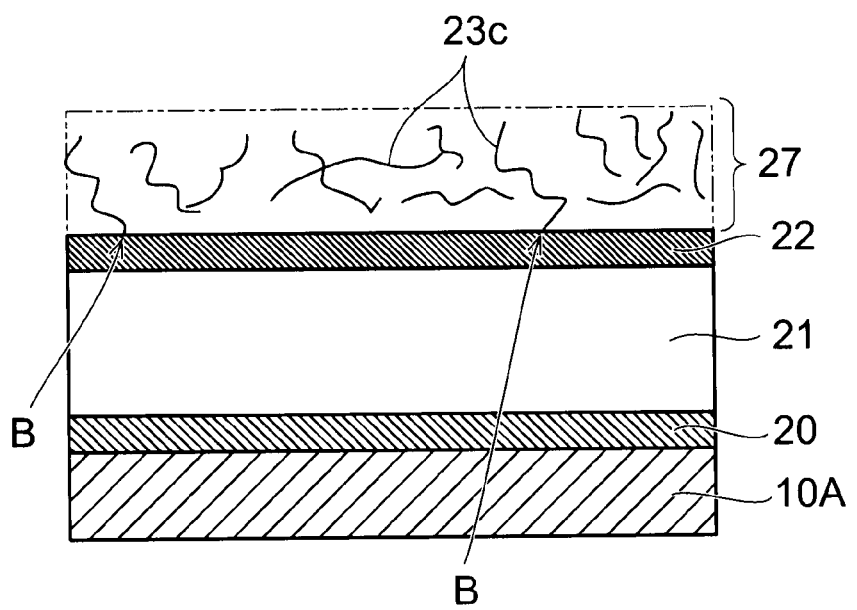
Figure 3B:
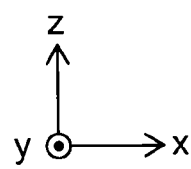

Then, as illustrated in FIG. 3B, the coated film 29 is heated to evaporate (vaporize) the solvent. Thereby, a CNT dispersion layer 27 in which the multiple CNTs 23c are dispersed without the solvent is formed on the metal film 22. The CNTs 23c are separated from each other on the metal film 22 at a prescribed spacing. Or, the CNTs 23c may be entangled with each other.

Figure 4A:
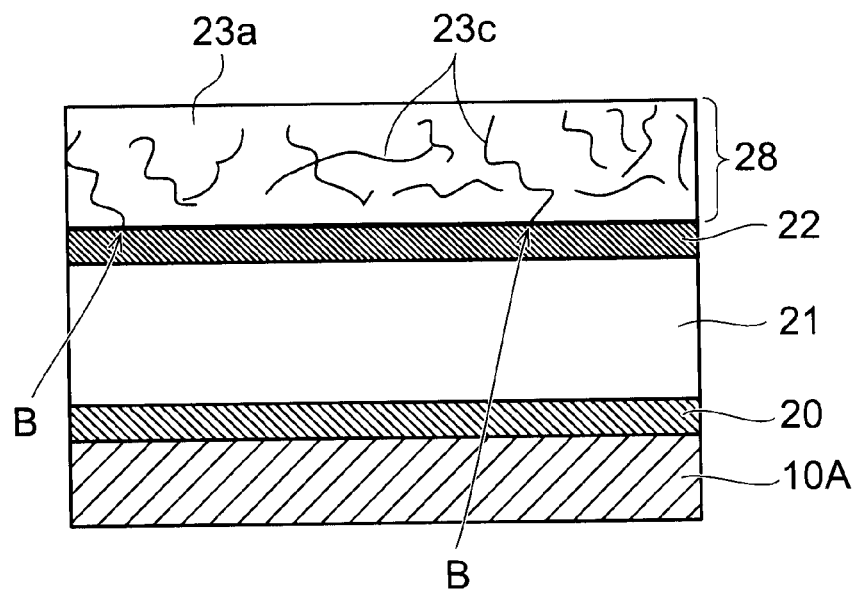
FIGS. 4A and 4B illustrate manufacturing processes of the memory cell portion of the nonvolatile memory device according to the first embodiment.

Continuing as illustrated in FIG. 4A, the insulator 23a is impregnated around the CNTs 23c using ALD (Atomic Layer Deposition), MLD (Molecular Layer Deposition), plasma CVD, coating, etc. Thereby, the insulator 23a is filled between the CNTs 23c. The insulator 23a is formed such that the CNTs 23c are covered with the insulator 23a. Thereby, a CNT dispersion layer 28 in which the multiple CNTs 23c are dispersed inside the insulator 23a is formed on the metal film 22.

Figure 4B:
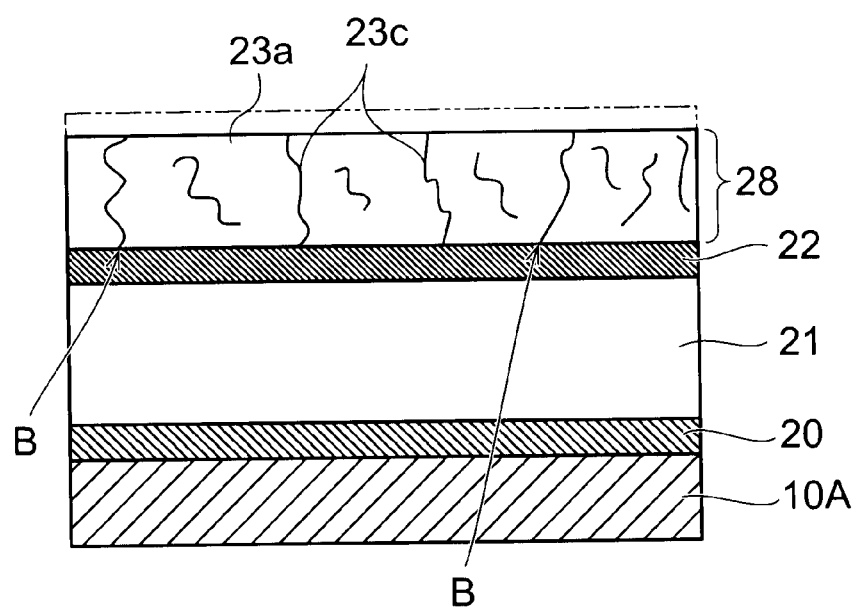

Then, as illustrated in FIG. 4B, CMP (Chemical Mechanical Polishing) is performed on the upper face side of the CNT dispersion layer 28 to planarize the upper face side of the insulator 23a. The CMP is adjusted such that one other end of at least one CNT 23c extending from the portion B is exposed from the insulator 23a. The portion of the CNT 23c exposed from the insulator 23a may be a portion of the CNT 23c other than the one other end recited above. In other words, a portion of the CNT 23c is exposed from the insulator 23a. The method for exposing the portion of the CNT 23c from the insulator 23a also may be used in other embodiments. The state in which the one end of the CNT 23c contacts the metal film 22 is maintained at the portion B. Thereby, a layer is formed in which at least one carbon nanotube 23c of the multiple carbon nanotubes 23c is exposed from the insulator 23a.

Figure 5A:
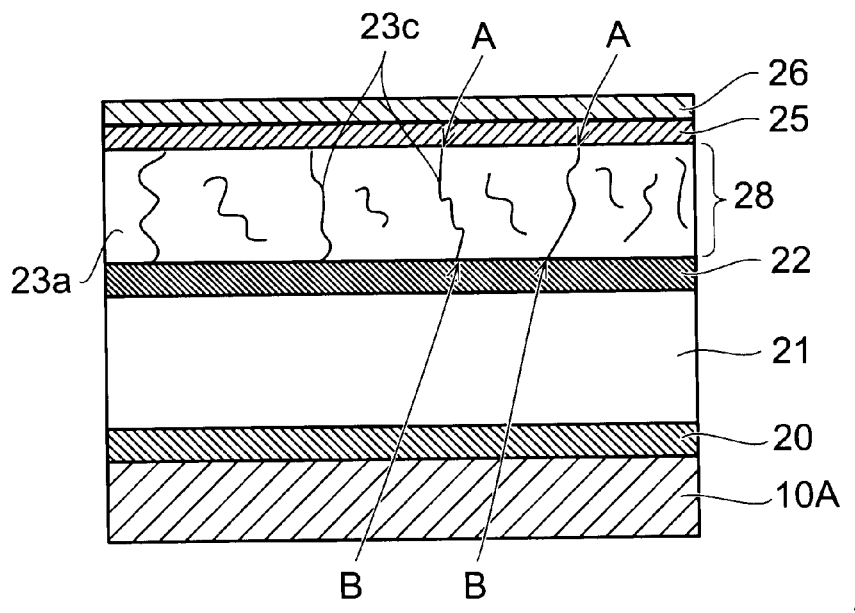
FIGS. 5A and 5B illustrate manufacturing processes of the memory cell portion of the nonvolatile memory device according to the first embodiment.

Continuing as illustrated in FIG. 5A, the metal film 25 is formed on the CNT dispersion layer 28. Thereby, at least one CNT 23c inside the CNT dispersion layer 28 contacts the metal film 25 at a portion A and contacts the metal film 22 at the portion B of the drawing.

Although the one end of the at least one carbon nanotube 23c of the multiple carbon nanotubes 23c contacts the metal film 22 and the one other end is electrically connected to the metal film 25 in the form illustrated in FIG. 5A, the form in which a bent portion of the carbon nanotube 23c contacts the metal film 22 or the metal film 25 also is included in the embodiment. Restated, in the CNT dispersion layer 28, the form in which one portion of at least one carbon nanotube 23c of the multiple carbon nanotubes 23c contacts the metal film 22 and a portion other than the one portion is electrically connected to the metal film 25 also is included in the embodiment.

Figure 5B:
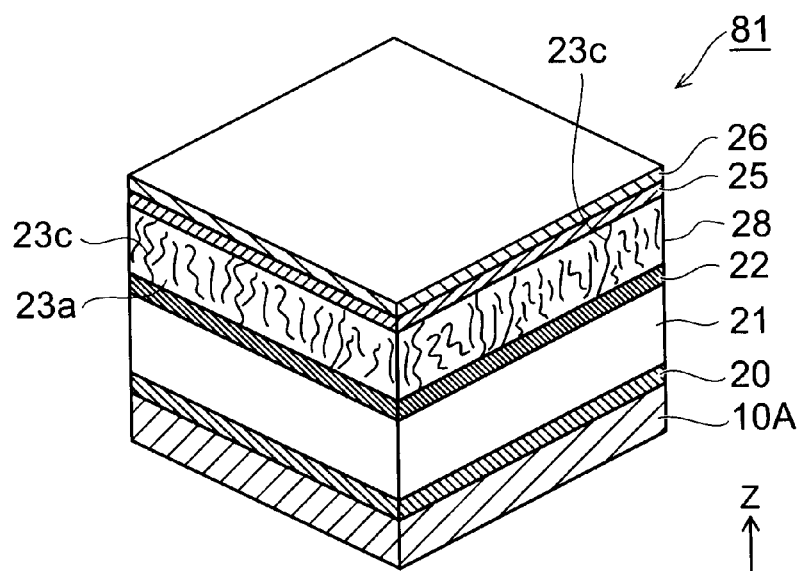

Continuing, the stopper interconnect film 26 is formed on the metal film 25 by sputtering or CVD. FIG. 5B is a schematic three-dimensional view of a stacked structure 81 formed by these processes.

Figure 6A:
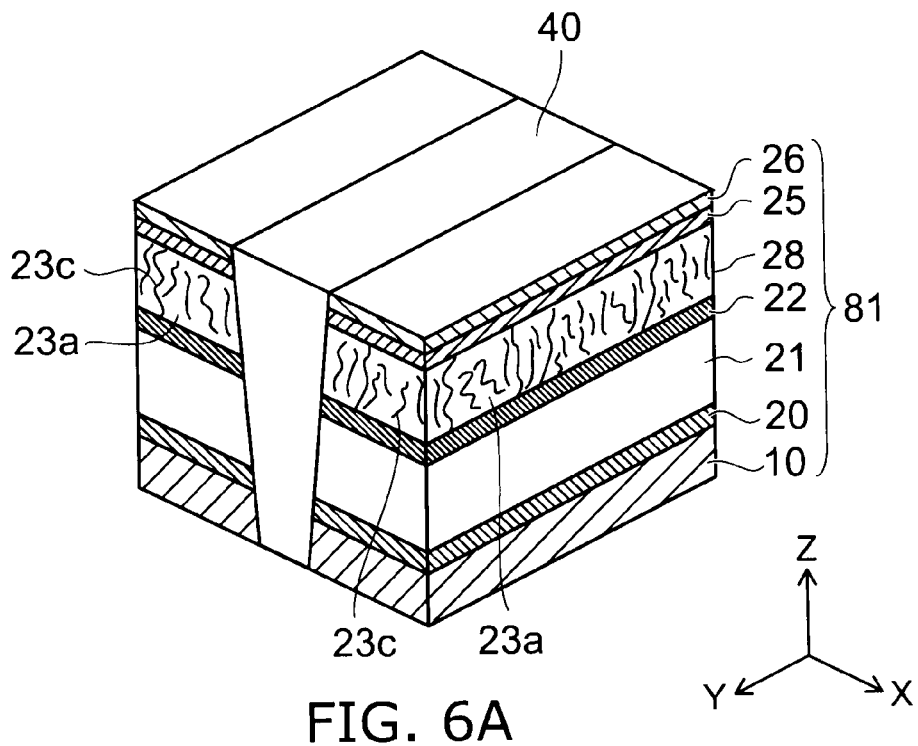
FIGS. 6A and 6B illustrate manufacturing processes of the memory cell portion of the nonvolatile memory device according to the first embodiment.

Then, a trench is made in the stacked structure 81 by selective etching; and the element-separating layer 40 is filled into the trench. This state is illustrated in FIG. 6A. The element-separating layer 40 extends in the Y-axis direction of the drawings. The lower interconnect 10 extending in the Y-axis direction is formed in the lowermost layer of the stacked structure 81.

Figure 6B:
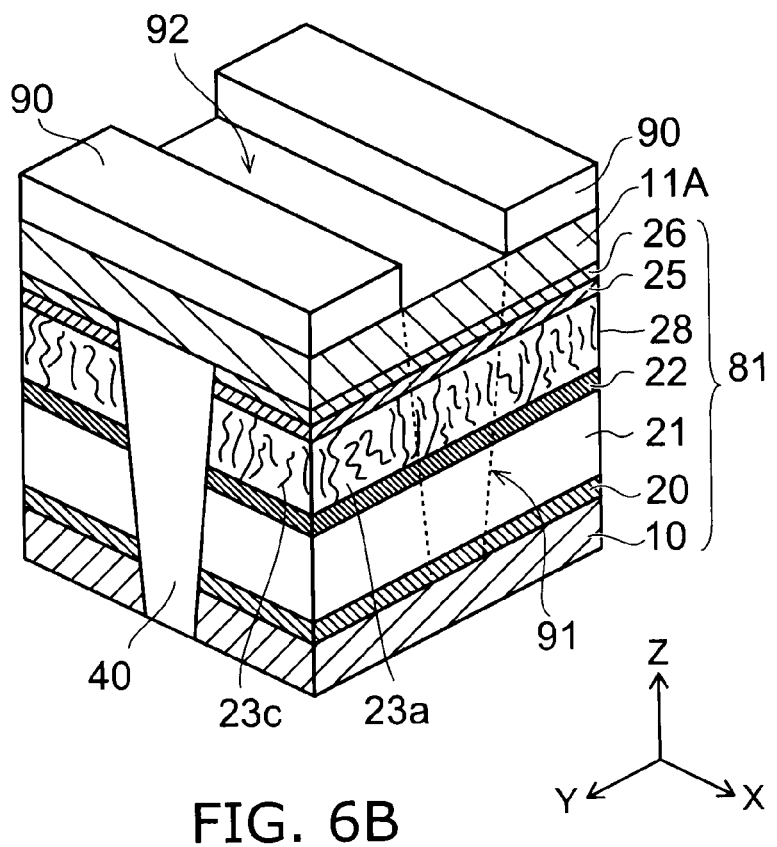

Continuing as illustrated in FIG. 6B, an upper interconnect layer 11A having a planar configuration (a spread configuration) is formed on the stacked structure 81 by, for example, sputtering or CVD. Continuing, a mask member (an oxide film) 90 is patterned on the upper interconnect layer 11A using photolithography.

Using the patterned mask member 90, a trench 92 extending in the X-axis direction is made between adjacent mask members 90. The direction in which the trench 92 extends is substantially orthogonal to the direction in which the lower interconnect 10 extends. The upper interconnect layer 11A is exposed at the bottom of the trench 92.

Figure 7A:
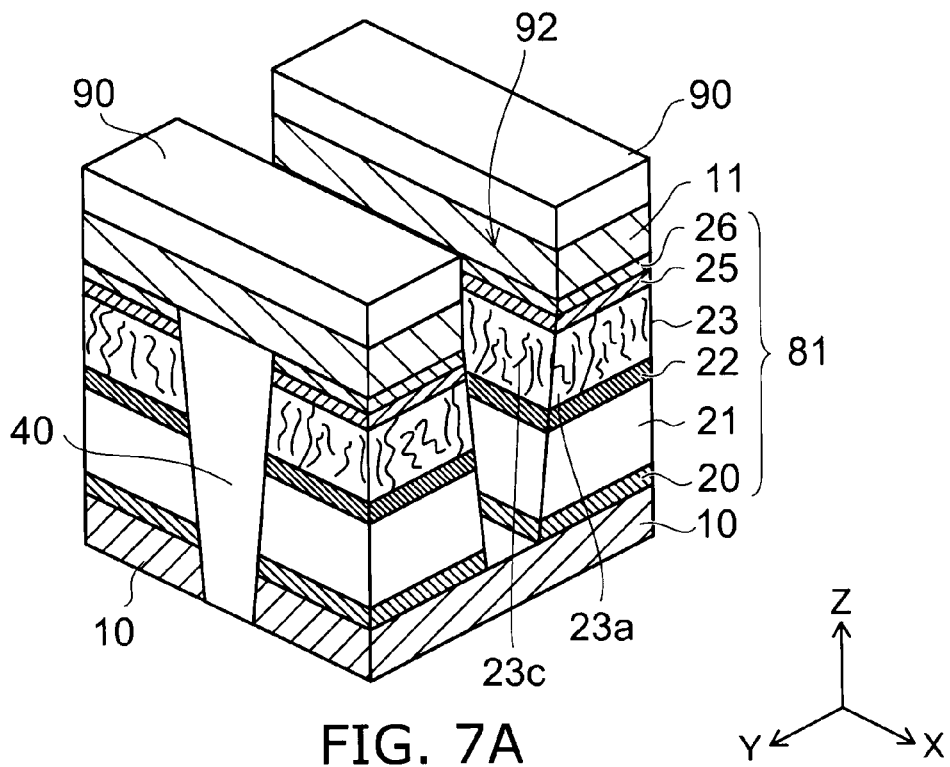
FIGS. 7A and 7B illustrate manufacturing processes of the memory cell portion of the nonvolatile memory device according to the first embodiment.

Then, the stacked structure 81 positioned below the trench 92 (the portion illustrated by the dotted line 91) is removed by etching. Thereby, the stacked structure 81 exposed in the trench 92 is selectively etched; and the layers from the upper interconnect layer 11A to the metal film 20 are removed. This state is illustrated in FIG. 7A. As illustrated, the trench 92 is dug deeper to expose the surface of the lower interconnect 10. The upper interconnect layer 11A is etched to form the upper interconnect 11 extending in the X-axis direction.

Figure 7B:
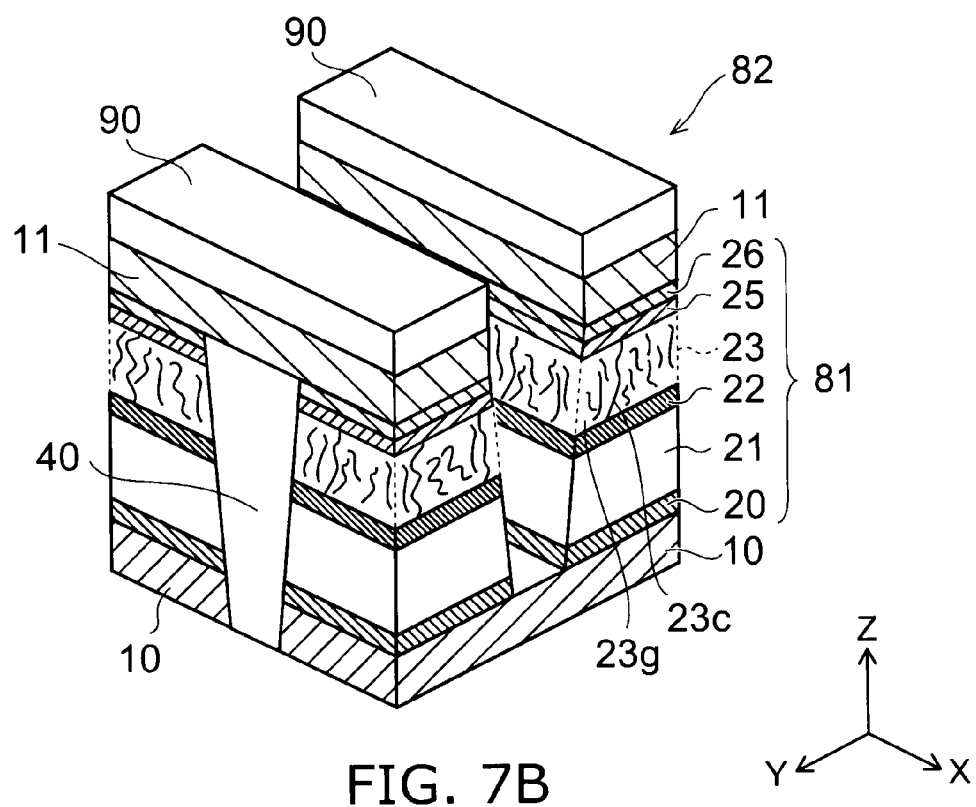

Continuing, dilute hydrofluoric acid solution processing, hydrofluoric acid vapor processing, ashing, organic solvent processing, etc., are performed inside the trench 92 to remove the insulator 23a from the CNT dispersion layer 28 as illustrated in FIG. 7B. Thereby, the gap 23g is formed between the metal film 22 and the metal film 25. The multiple CNTs 23c are dispersed in the gap 23g. The gap 23g may be formed in the stage illustrated in FIG. 6A by removing the insulator 23a from the CNT dispersion layer 28 prior to the forming of the element-separating layer 40.

Figure 8:
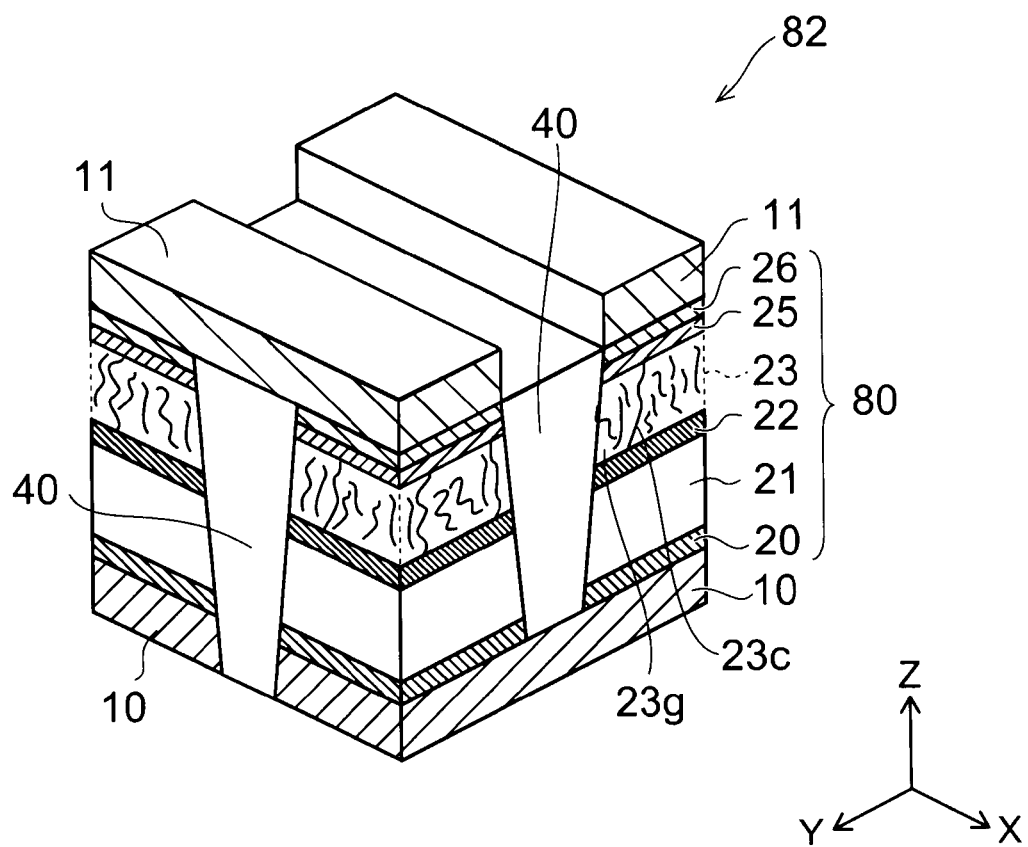
FIG. 8 illustrates a manufacturing process of the memory cell portion of the nonvolatile memory device according to the first embodiment.

The material of the element-separating layer 40 is selected to be a material that is not easily etched by the etchant of the insulator 23a. For example, in the case where silicon oxide ($SiO_2$), etc., are selected as the insulator 23a, silicon nitride ($Si_3N_4$), etc., are selected as the element-separating layer 40. Subsequently, as illustrated in FIG. 8, the element-separating layer 40 is filled into the trench 92. The surface of the upper interconnect 11 is exposed by removing the mask member 90 described above using CMP.

By such manufacturing processes, the memory cell 80 including the CNT-containing layer 23 is formed at a position where the lower interconnect 10 is substantially orthogonal to the upper interconnect 11.

The removal process of the insulator 23a illustrated in FIG. 7B may be omitted when forming the memory cell 80 illustrated in FIG. 2C.

Figure 9A:
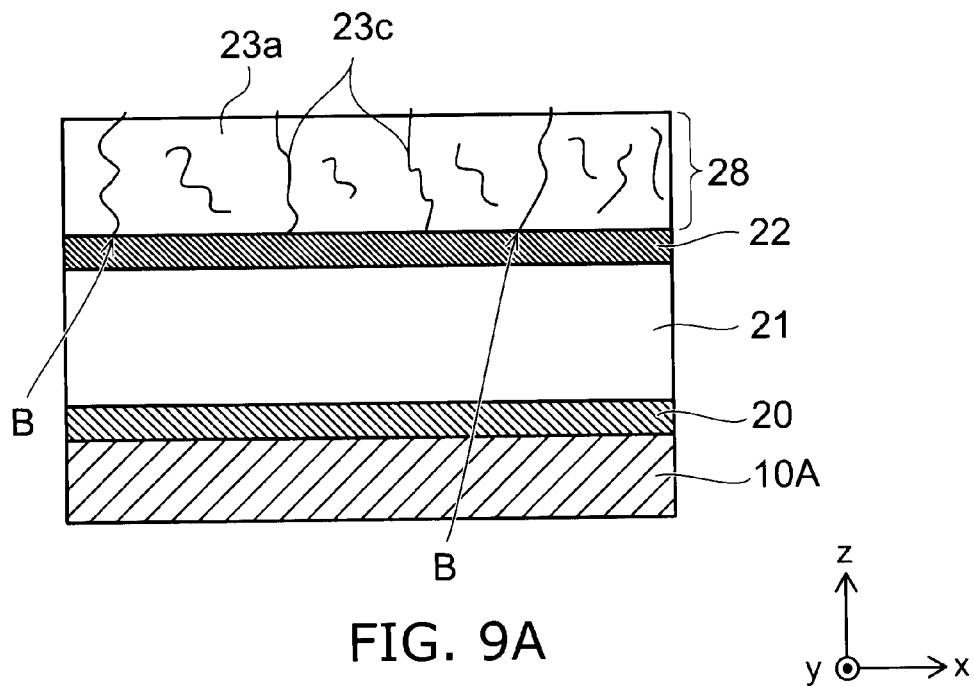
FIGS. 9A and 9B illustrate manufacturing processes of the memory cell portion of the nonvolatile memory device according to the first embodiment.
Figure 9B:
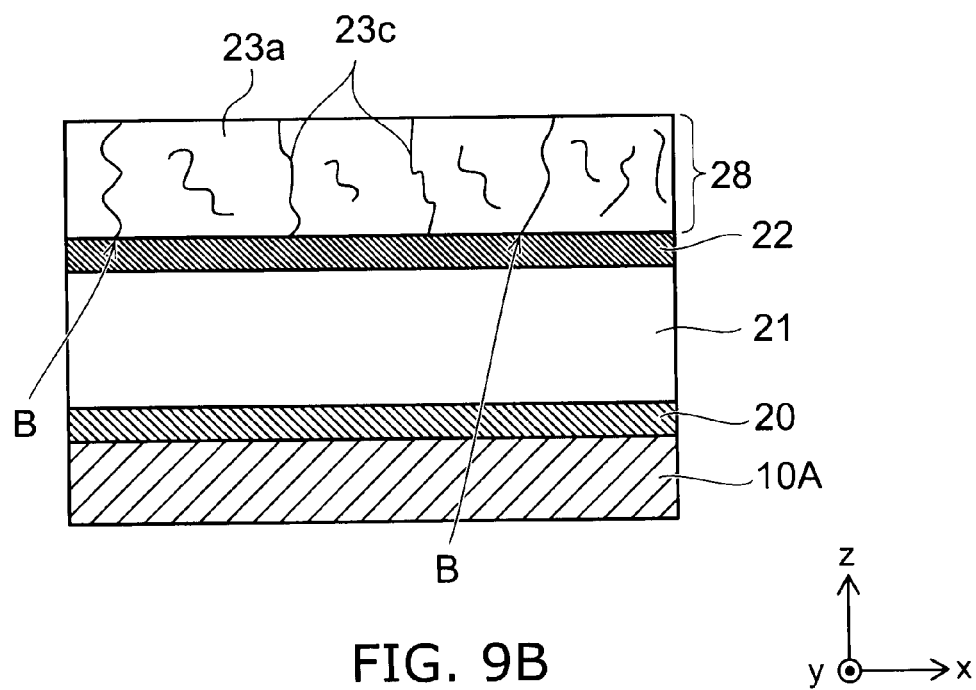

The processes illustrated in FIGS. 9A and 9B may be performed instead of the process illustrated in FIG. 4B.

For example, CMP may be performed on the upper face of the CNT dispersion layer 28 as illustrated in FIG. 9A after forming the CNT dispersion layer 28 illustrated in FIG. 4A. The CMP is performed such that ends of the CNTs 23c protrude from the surface of the insulator 23a.

Then, ashing is performed on the surface of the CNT dispersion layer 28 to selectively remove the CNTs. Thereby, the protruding portions of the CNTs 23c are removed. At this time, it is adjusted such that the plane of the ends of the CNTs 23c is the same as the plane of the surface of the insulator 23a. This state is illustrated in FIG. 9B. Subsequently, processing is started from the manufacturing process illustrated in FIG. 5A. Thereby, there is at least one CNT 23c inside the CNT-containing layer 23 that contacts the metal film 25 at the portion A and contacts the metal film 22 at the portion B.

Figure 10A:
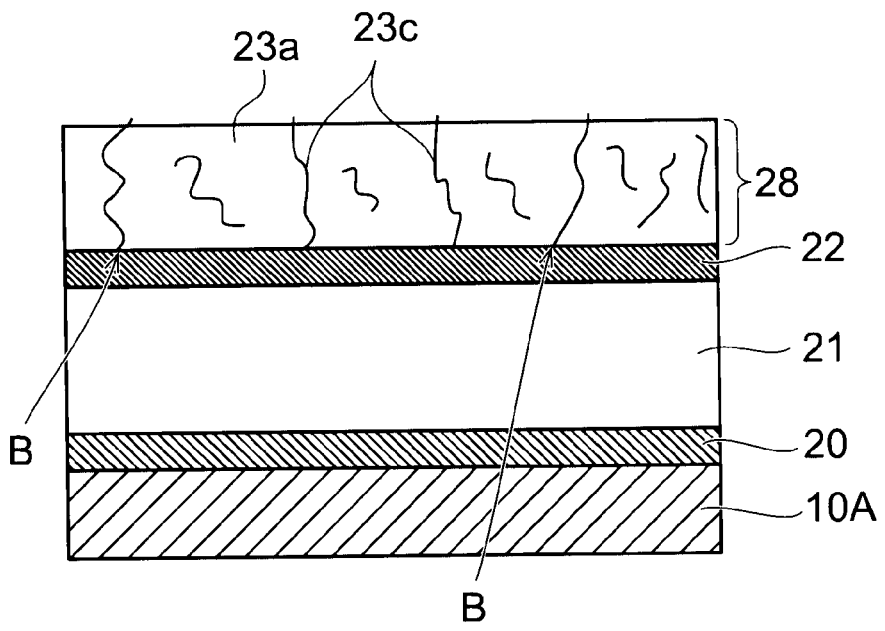
FIGS. 10A and 10B illustrate manufacturing processes of the memory cell portion of the nonvolatile memory device according to the first embodiment.
Figure 10B:
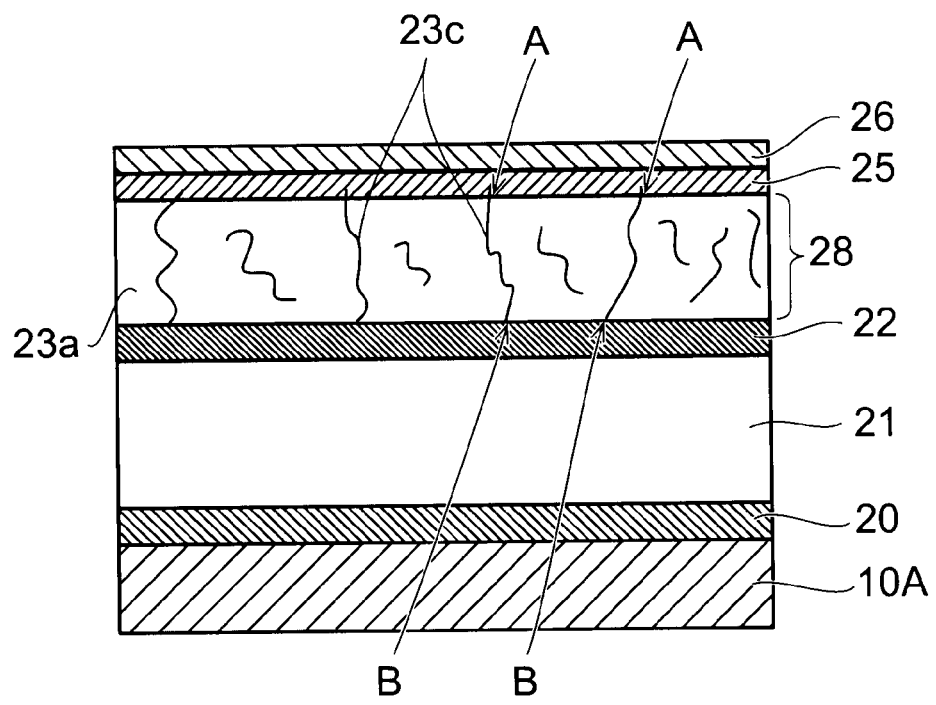

The processes illustrated in FIGS. 10A and 10B may be performed instead of the process illustrated in FIG. 4B.

For example, as illustrated in FIG. 10A, processing is performed such that the end of at least one CNT 23c protrudes from the surface of the insulator 23a.

Continuing, the metal film 25 is formed on the CNT dispersion layer 28. This state is illustrated in FIG. 10B. According to such a method, the end of the CNT 23c protruding at the portion A extends into the metal film 25. In other words, the end of the CNT 23c protruding from the surface of the insulator 23a is inserted into the metal film 25. Thereby, the contact properties between the end of the CNT 23c and the metal film 25 are increased.

By such manufacturing processes, the memory cell 80 including the CNT-containing layer 23 is formed.

Figure 11A:
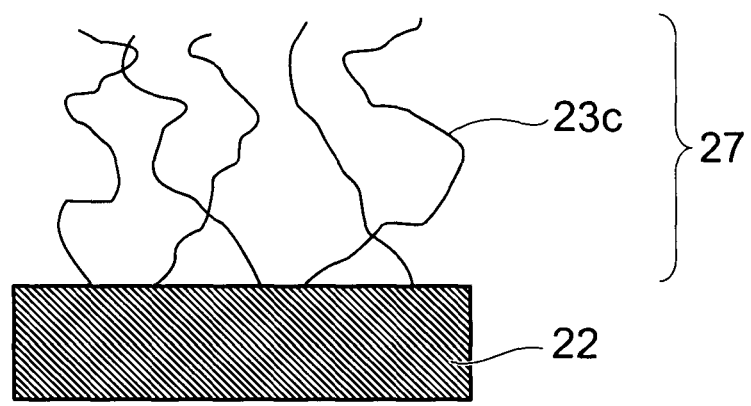
FIGS. 11A and 11B illustrate manufacturing processes of a nonvolatile memory device according to a comparative example.
Figure 11B:
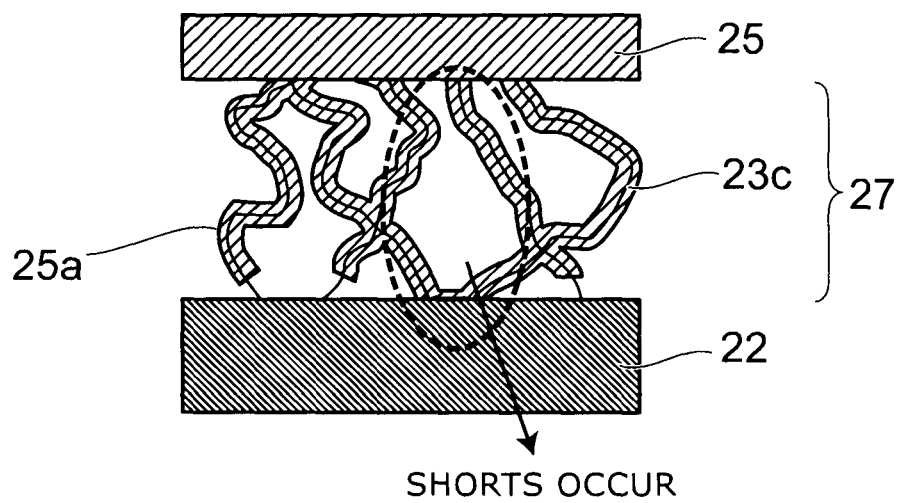

Conversely, FIGS. 11A and 11B illustrate manufacturing processes according to a comparative example. The comparative example illustrates a process in which the insulator 23a is not formed prior to forming the metal film 25.

FIGS. 11A and 11B illustrate the manufacturing processes of the nonvolatile memory device according to the comparative example.

In the comparative example as illustrated in FIG. 11A, the CNT dispersion layer 27 in which the multiple CNTs 23c are dispersed is formed on the metal film 22. Subsequently, the insulator 23a is not formed; and the metal film 25 is formed directly on the CNT dispersion layer 27 using, for example, sputtering. This state is illustrated in FIG. 11B.

In such manufacturing processes, metal components 25a of the metal film 25 undesirably adhere around the CNTs 23c because the insulator 23a does not exist under the metal film 25 prior to the forming of the metal film 25. There are cases where a current path is formed between the metal film 25 and the metal film 22 by the metal components 25a deposited around the CNTs 23c (referring to the CNTs 23c enclosed with the broken line). As a result, there are cases where the metal film 22 shorts to the metal film 25 via the metal components 25a.

Even in the case where the metal components 25a from the metal film 25 do not reach the metal film 22 directly after forming the metal film 25, there are cases where the metal components 25a diffuse gradually and the metal film 22 shorts to the metal film 25 via the metal components 25a. In particular, the risk of the metal film 22 shorting to the metal film 25 increases as the thickness of the CNT dispersion layer 27 decreases.

Methods to suppress electrical shorts in the comparative example include increasing the thickness of the CNT dispersion layer 27 (e.g., to not less than 80 nm). However, such methods necessarily result in the memory cell 80 having an undesirably high aspect ratio. As a result, in the comparative example, there are cases where the mechanical strength of the memory cell 80 decreases and the memory cell 80 collapses in a manufacturing process or during operations. Thereby, the manufacturing yield decreases and the reliability decreases.

Conversely, in the manufacturing processes according to the embodiment, the metal film 25 is formed on the CNT dispersion layer 28 after forming the CNT dispersion layer 28 including the insulator 23a. Accordingly, the metal components 25a of the metal film 25 are shielded by the CNT dispersion layer 28 and do not easily diffuse to the metal film 22. As a result, the metal film 22 does not easily short to the metal film 25.

Because the metal film 22 does not easily short to the metal film 25, a CNT dispersion layer 28 of, for example, 80 nm or less can be formed. As a result, the aspect ratio of the memory cell 80 can be reduced. Accordingly, the vertical patterning of the memory cell 80 is easier; and the mechanical strength of the memory cell 80 increases.

In the manufacturing processes according to the embodiment, the surface of the CNT dispersion layer 28 is planarized by the CMP process. Accordingly, in the manufacturing processes of the layers on the CNT dispersion layer 28, focal position shift of the photolithography, etc., do not occur easily. As a result, a finer memory cell can be formed. Thus, according to the method for manufacturing the nonvolatile memory device of the embodiment, the characteristics of the nonvolatile memory device are improved further; and the memory cell can be downscaled further.

Second Embodiment

Another variation of the manufacturing processes of the memory cell will now be described. Herein, a variation of the manufacturing processes that form the layer in which the CNTs 23c are dispersed inside the insulator 23a will mainly be described.

Figure 12A:
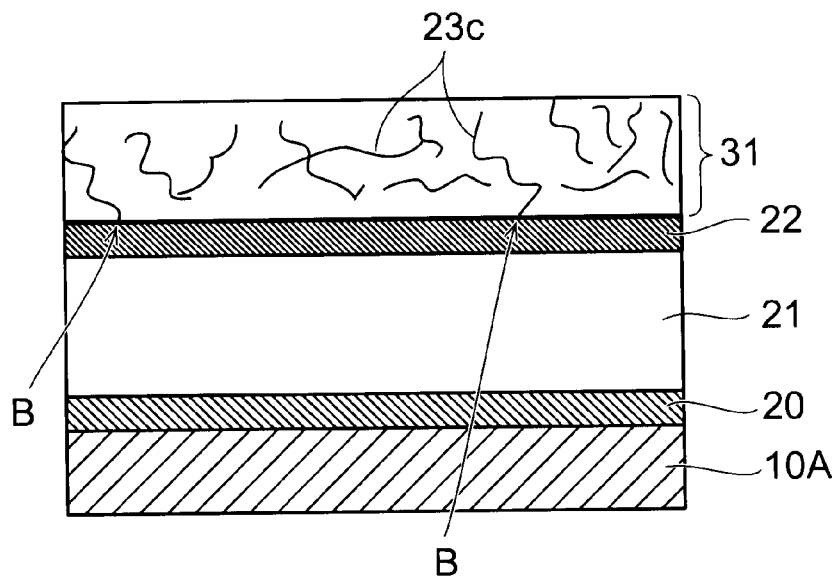
FIGS. 12A and 12B illustrate manufacturing processes of a memory cell portion of a nonvolatile memory device according to a second embodiment.
Figure 12B:
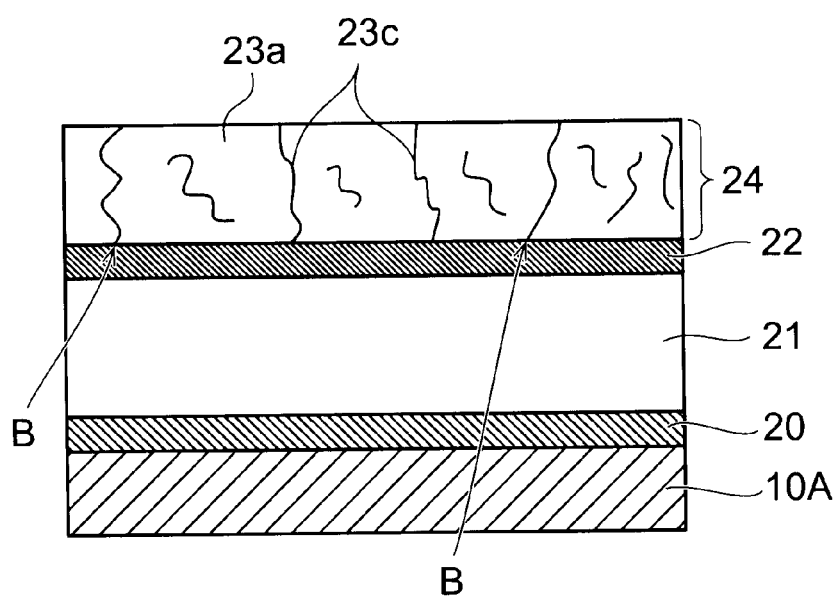

FIGS. 12A and 12B illustrate the manufacturing processes of the memory cell according to the second embodiment.

First, as illustrated in FIG. 12A, a stacked film of the metal film 20/the diode layer 21/the metal film 22 is formed in this order on the lower interconnect layer 10A.

Then, a fluid 31 including the multiple CNTs 23c is placed onto the major surface (the upper face) of the metal film 22 using coating. The coating is performed by spin coating. A solvent including the elements included in the insulator 23a described above may be used as the solvent of the fluid. Silanol, for example, may be used as the solvent. In other words, a fluid in which the multiple CNTs 23c are dispersed in a silanol ($Si(OH)_4$)-containing solvent may be used as the fluid 31. Then, after coating the fluid 31, the fluid 31 is heated. The heating evaporates the solvent components and causes a dehydrating polymerization reaction of the silanol.

The multiple CNTs 23c and fine particles of the insulator 23a may be contained in water or alcohol as another example of the fluid 31. Such a fluid also may be heated to evaporate the water and alcohol included in the fluid.

It is desirable for the specific gravity of the CNTs 23c inside the fluid 31 to be greater than that of the solvent. Thereby, the CNTs 23c sink due to their own weight; and it is easier for one end of one of the CNTs 23c to contact the metal film 22 positioned below the fluid 31 (referring to the portion B). After the heating, a dehydrating polymerization reaction of the silanol is performed; and a CNT dispersion layer 24 in which the multiple CNTs 23c are dispersed inside the insulator 23a is formed on the metal film 22. This state is illustrated in FIG. 12B. The main component of the insulator 23a is silicon oxide ($SiO_2$).

Continuing, CMP is performed on the upper face side of the CNT dispersion layer 24 to planarize the upper face side of the CNT dispersion layer 24. Thereby, the surface of the insulator 23a is planarized. At this time, the processing is such that one other end of the at least one CNT 23c is exposed from the CNT dispersion layer 24.

Subsequently, as described using FIGS. 5A and 5B, the metal film 25 and the stopper interconnect film 26 are formed on the CNT dispersion layer 24 using sputtering or CVD. Thereby, at least one CNT 23c that contacts the metal film 25 at the portion A and contacts the metal film 22 at the portion B is formed inside the CNT-containing layer 23. The subsequent processes are similar to those of the first embodiment. According to such manufacturing processes, the CNT dispersion layer 24 having the multiple CNTs 23c dispersed inside the insulator 23a is formed without the insulator 23a being impregnated around the CNTs 23c using ALD, MLD, plasma CVD, coating, etc. Effects similar to those of the first embodiment are obtained for such manufacturing processes as well. In particular, in the second embodiment, the manufacturing cost is lower because the process of impregnating the insulator 23a around the CNTs 23c using the ALD, MLD, plasma CVD, coating, etc., can be omitted.

Third Embodiment

In a third embodiment, how to expose the CNTs 23c from the insulator 23a is described for different cases according to the state of the CNTs 23c proximal to the surface of the insulator 23a after coating the fluid 31 on the metal film 22. In the third embodiment, cross-sectional views that are more microscopic than FIGS. 3A and 3B, etc., are used to describe the state proximal to the surface of the insulator 23a.

First Specific Example

In the first specific example, the manufacturing processes recited below are performed prior to the forming of the layer in which the at least one carbon nanotube 23c of the multiple carbon nanotubes 23c is exposed from the surface of the insulator 23a.

Figure 13A:
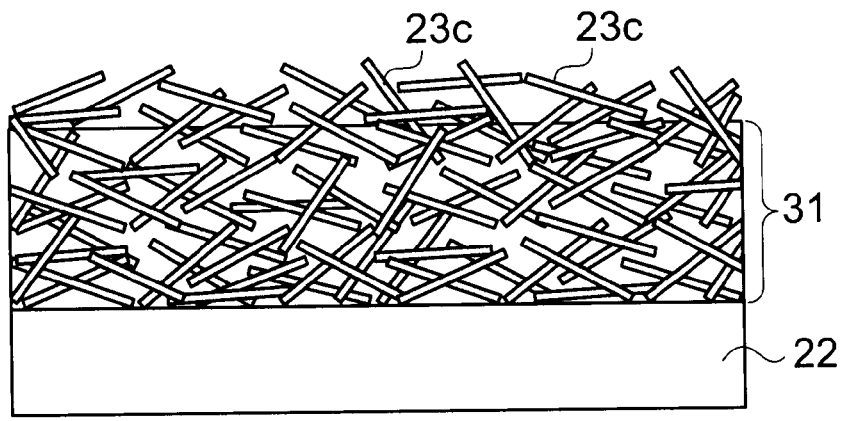
FIGS. 13A to 13C illustrate manufacturing processes of a memory cell portion of a nonvolatile memory device according to a first specific example of a third embodiment.
Figure 13B:
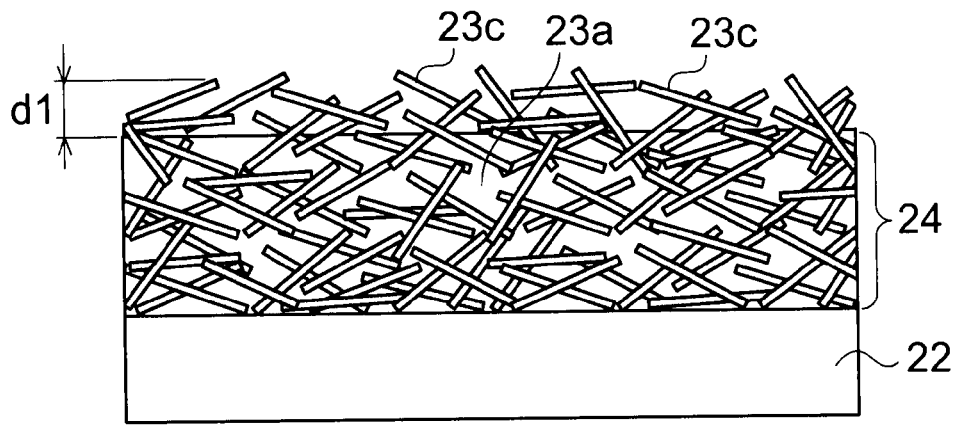
Figure 13C:
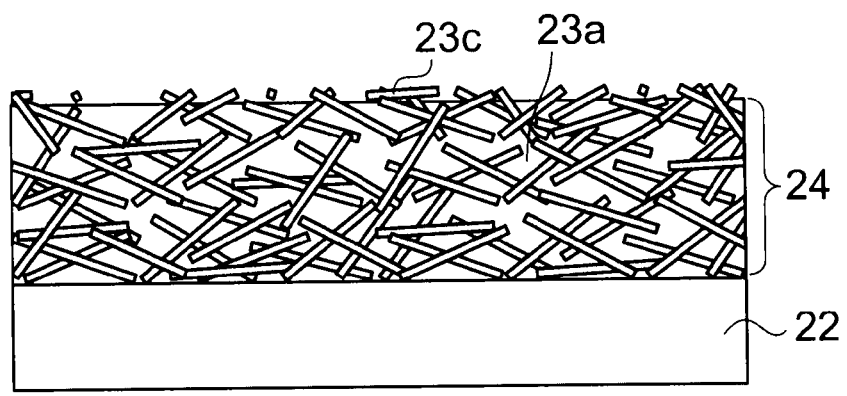

FIGS. 13A to 13C illustrate the manufacturing processes of the memory cell portion of the nonvolatile memory device according to the first specific example of the third embodiment.

As illustrated in FIG. 13A, the fluid 31 including the multiple CNTs 23c is placed onto the major surface (the upper face) of the metal film 22 using coating. The coating is performed by spin coating. A silanol ($Si(OH)_4$)-containing solvent or methylsilsesquioxane (MSQ)-containing solvent may be used as the solvent of the fluid 31. An organic solvent such as, for example, alcohol may be used as the solvent. Or, the multiple CNTs 23c and fine particles of the insulator 23a may be contained in water or alcohol as another example of the fluid 31.

It is desirable for the specific gravity of the CNTs 23c inside the fluid 31 to be greater than that of the solvent. Thereby, the CNTs 23c sink due to their own weight; and one end of one of the CNTs 23c contacts the metal film 22 positioned below the fluid 31 more easily.

FIG. 13A illustrates a state in which a portion of the multiple CNTs 23c is exposed from the surface of the fluid 31 after the fluid 31 is placed on the major surface of the metal film 22. The fluid 31 is heated in such a state. The heating causes the solvent components to evaporate, the silanol and the methylsilsesquioxane to undergo a dehydrating polymerization reaction, and the fine particles to link to each other. This state is illustrated in FIG. 13B.

After the heating as illustrated in FIG. 13B, the CNT dispersion layer 24 in which the multiple CNTs 23c are dispersed inside the insulator 23a is formed on the metal film 22. The main components of the insulator 23a are silicon oxide ($SiO_2$) and polymethylsilsesquioxane (PMSQ).

In the first specific example, because the heating is performed in the state in which a portion of the multiple CNTs 23c is exposed from the surface of the fluid 31, at least one carbon nanotube 23c of the multiple carbon nanotubes 23c is exposed from the surface of the insulator 23a.

In the case where a thickness dl of the carbon nanotube 23c from the surface of the insulator 23a is greater than the thickness of the metal film 25 to be formed on the CNT dispersion layer 24, a portion of the exposed carbon nanotube 23c is removed. For example, a portion of the exposed carbon nanotube 23c is removed such that the thickness dl is less than the thickness of the metal film 25.

If the thickness d1 is not less than the thickness of the metal film 25, there is a risk that the carbon nanotube 23c may extend through the metal film 25 after the metal film 25 is formed on the CNT dispersion layer 24 to directly contact the stopper interconnect film 26 and the upper interconnect 11.

As illustrated in FIG. 13C, to eliminate such a discrepancy in the first specific example, the thickness d1 is adjusted to be less than the thickness of the metal film 25 by removing a portion of the exposed carbon nanotube 23c. The portion of the carbon nanotube 23c may be removed using, for example, CMP and dry etching.

The dry etching is, for example, RIE (Reactive Ion Etching), ashing, etc. The etchant of the dry etching may be selected from an oxygen ($O_2$)-based gas, a carbon dioxide ($CO_2$)-based gas, an ammonia ($NH_3$)-based gas, and a nitrogen ($N_2$)/hydrogen ($H_2$) gas mixture; or two or more of these gases may be combined as the etchant.

Thus, if the thickness d1 is adjusted to be less than the thickness of the metal film 25, the carbon nanotube 23c does not extend through the metal film 25 to directly contact the stopper interconnect film 26 and the upper interconnect 11.

In the case where the thickness d1 is less than the thickness of the metal film 25, it is sufficient to form the metal film 25 on the CNT dispersion layer 24 without removing the portion of the exposed carbon nanotube 23c.

When removing the portion of the exposed carbon nanotube 23c, the height of multiple carbon nanotubes 23c from the surface of the metal film 22 may be adjusted to be substantially the same as the height of the insulator 23a from the surface of the metal film 22. In such a form, a layer is formed in which at least one carbon nanotube 23c of the multiple carbon nanotubes 23c is exposed from the surface of the insulator 23a.

In such a case, the height of the multiple carbon nanotubes 23c is taken as the height of the carbon nanotube 23c thereof that is positioned highest from the surface of the metal film 22.

Subsequently, as described using FIGS. 5A and 5B, the metal film 25 and the stopper interconnect film 26 are formed on the CNT dispersion layer 24 using sputtering or CVD.

Second Specific Example

In a second specific example, the manufacturing processes recited below are performed prior to the forming of the layer in which the at least one carbon nanotube 23c of the multiple carbon nanotubes 23c is exposed from the surface of the insulator 23a.

Figure 14A:
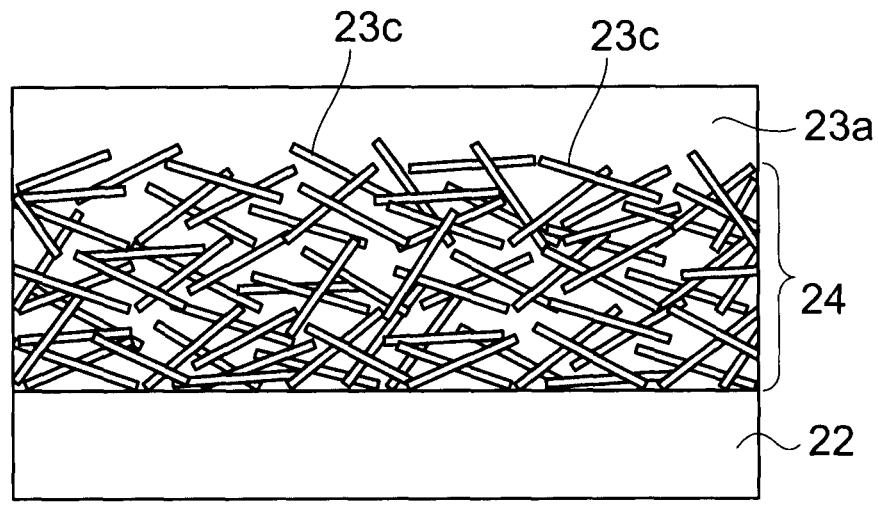
FIGS. 14A and 14B illustrate manufacturing processes of a memory cell portion of a nonvolatile memory device according to a second specific example of the third embodiment.
Figure 14B:
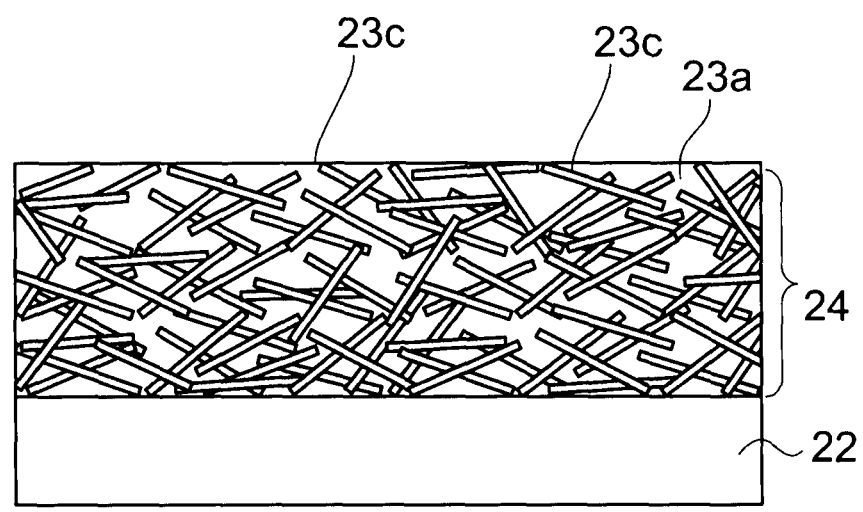

FIGS. 14A and 14B illustrate the manufacturing processes of the memory cell portion of the nonvolatile memory device according to the second specific example of the third embodiment.

FIG. 14A illustrates the state after heating the fluid 31. As illustrated in FIG. 14A, the multiple carbon nanotubes 23c are covered with the insulator 23a. In such a case, the surface of the insulator 23a is removed.

For example, as illustrated in FIG. 14B, the at least one carbon nanotube 23c of the multiple carbon nanotubes 23c is exposed from the surface of the insulator 23a by removing the surface of the insulator 23a. The surface of the insulator 23a is removed using, for example, CMP, dry etching, wet etching, etc. The etchant of the dry etching may be, for example, a fluorine (F)-based gas, a fluorocarbon (CF)-based gas, etc. The etchant of the wet etching may be a dilute HF solution, etc.

Subsequently, as described using FIGS. 5A and 5B, the metal film 25 and the stopper interconnect film 26 are formed on the CNT dispersion layer 24 using sputtering or CVD.

Third Specific Example

Figure 15:
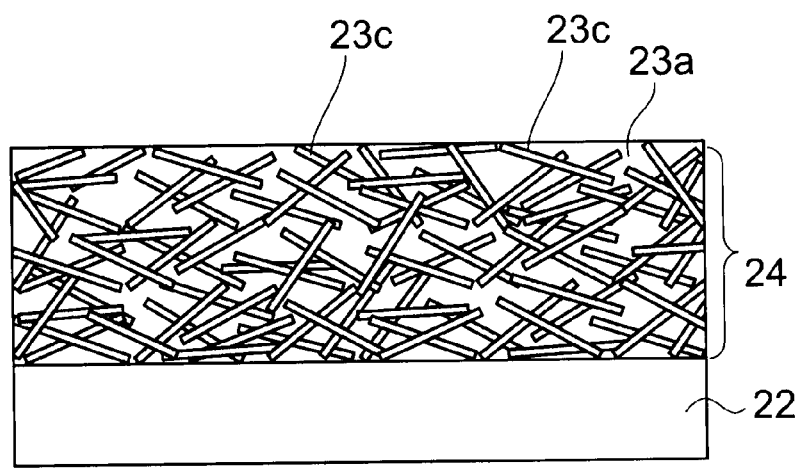
FIG. 15 illustrates a manufacturing process of a memory cell portion of a nonvolatile memory device according to a third specific example of the third embodiment.

FIG. 15 illustrates the manufacturing process of the memory cell portion of the nonvolatile memory device according to a third specific example of the third embodiment.

When placing the fluid 31 including the multiple CNTs 23c on the major surface of the metal film 22 by coating in the third specific example, the amount (the volume (V) or the weight (kg)) of the multiple CNTs 23c or the solvent of the fluid 31 is adjusted beforehand to control the height of the multiple carbon nanotubes 23c from the surface of the metal film 22 to be the same as the height of the insulator 23a from the surface of the metal film 22. Thereby, the layer is formed in which at least one carbon nanotube 23c of the multiple carbon nanotubes 23c is exposed from the surface of the insulator 23a without removing the surface of the insulator 23a.

Subsequently, as described using FIGS. 5A and 5B, the metal film 25 and the stopper interconnect film 26 are formed on the CNT dispersion layer 24 using sputtering or CVD.

Fourth Specific Example

In a fourth specific example, the manufacturing processes recited below are performed prior to the forming of the layer in which the at least one carbon nanotube 23c of the multiple carbon nanotubes 23c is exposed from the surface of the insulator 23a.

Figure 16A:
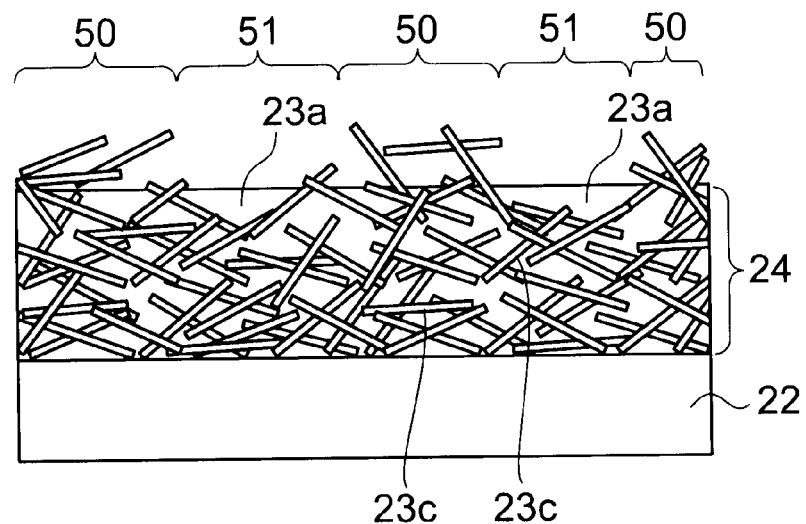
FIGS. 16A and 16B illustrate manufacturing processes of a memory cell portion of a nonvolatile memory device according to a fourth specific example of the third embodiment.
Figure 16B:
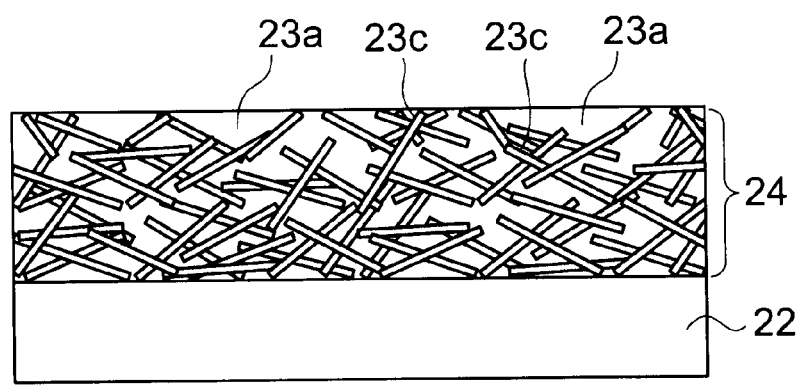

FIGS. 16A and 16B illustrate the manufacturing processes of the memory cell portion of the nonvolatile memory device according to the fourth specific example of the third embodiment.

FIG. 16A illustrates the state after heating the fluid 31. As illustrated in FIG. 16A, a group 50 of a portion of the multiple carbon nanotubes 23c dispersed inside the insulator 23a is selectively exposed from the surface of the insulator 23a. In such a case, a region 51 where the carbon nanotubes 23c are not exposed is selectively formed in the surface of the insulator 23a. Restated, the multiple carbon nanotubes 23c are dispersed inside the insulator 23a with an uneven configuration.

In such a case, there is a risk that the metal film 25 may deform due to effects of the uneven configuration when the metal film 25 is formed on the CNT dispersion layer 24; and the electrical contact properties between the carbon nanotubes 23c and the metal film 25 may worsen. Or, there is a risk that a normal stacked structure of the metal film 22/the CNT-containing layer 24/the metal film 25 cannot be maintained. For example, the stacked structure of the metal film 22/the CNT-containing layer 24/the metal film 25 may collapse, undesirably resulting in a structure such as a structure in which the insulator 23a is inserted from under the metal film 25.

In such a case, a portion of the multiple carbon nanotubes 23c and the surface of the insulator 23a are removed such that the height of the multiple carbon nanotubes 23c from the surface of the metal film 22 is the same as the height of the insulator 23a from the surface of the metal film 22.

Thereby, the surface of the CNT dispersion layer 24 becomes substantially smooth; the decrease of the electrical reliability due to the deformation of the metal film 25 is suppressed; and the degradation of the vertical configuration of the memory cell 80 is suppressed.

In the third embodiment as described above, the electrical connection between the carbon nanotubes 23c and the metal film 25 is formed reliably by exposing at least one carbon nanotube 23c of the multiple carbon nanotubes 23c from the surface of the insulator 23a. As a result, the reliability of the nonvolatile memory device increases further.

The insulator 23a of the third embodiment is not limited to a coated insulating layer; and the insulator 23a impregnated into the multiple carbon nanotubes 23c illustrated in the first embodiment may be used.

Fourth Embodiment

Yet another variation of the manufacturing processes of the memory cell will now be described. Herein, a variation of the manufacturing processes that form the layer in which the CNTs 23c are dispersed inside the insulator 23a will mainly be described.

FIG. 17A to FIG. 18B illustrate the manufacturing processes of the memory cell according to the fourth embodiment.

Figure 17A:
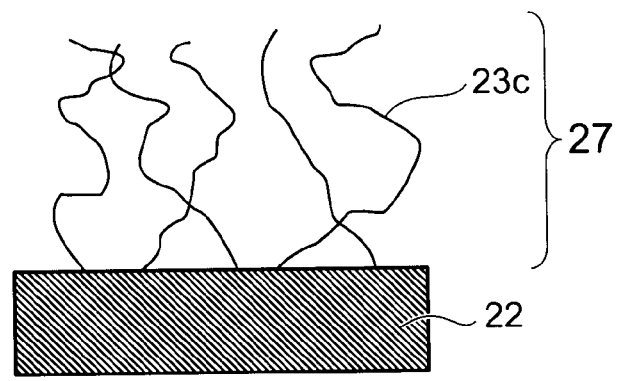
FIGS. 17A to 17C illustrate manufacturing processes of a memory cell portion of a nonvolatile memory device according to a fourth embodiment.

As illustrated in FIG. 17A, the multiple CNTs 23c are placed on the metal film 22; and the CNT dispersion layer 27 in which the multiple CNTs 23c are dispersed is formed on the metal film 22.

Figure 17B:
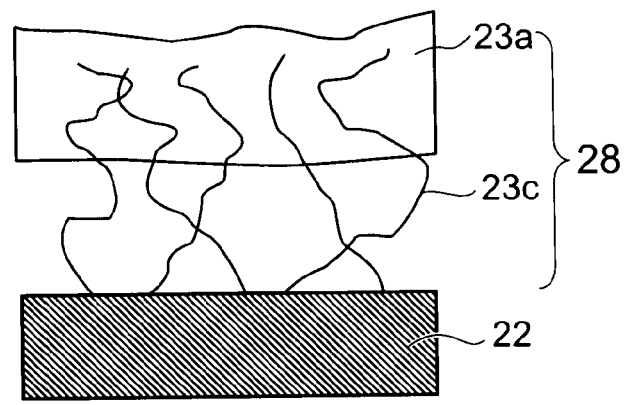

Continuing as illustrated in FIG. 17B, the insulator 23a is impregnated into the upper side of the CNT dispersion layer 27 using ALD, MLD, plasma CVD, coating, etc. The insulator 23a is formed such that all of the one other ends of the CNTs 23c are covered with the insulator 23a. The insulator 23a is filled between the CNTs 23c at the upper side of the CNT dispersion layer 27.

At this time, the insulator 23a may be separated from the metal film 22. In other words, the gap 23g may be formed between the insulator 23a and the metal film 22. Even in such a configuration, the insulator 23a functions as a barrier layer of the metal film 25 described below because the insulator 23a is provided on the upper side of the CNT dispersion layer 28.

Figure 17C:
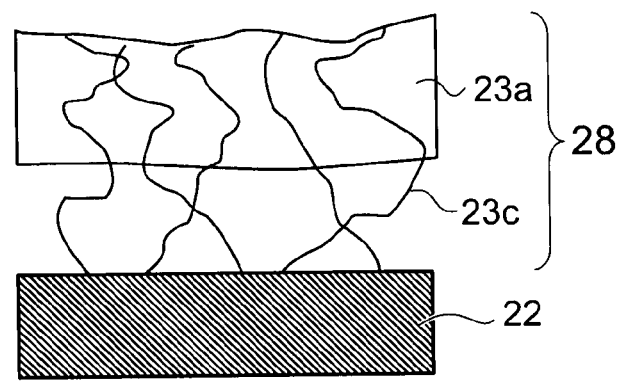

Continuing as illustrated in FIG. 17C, etch-back of the CNT dispersion layer 28 is performed to expose the at least one end of the CNTs 23c from the surface of the insulator 23a (not illustrated). The etch-back method may be dry etching or wet etching. The surface of the CNT dispersion layer 27 after the etch-back is uneven to reflect the different heights of the one other ends of the CNTs 23c.

Figure 18A:
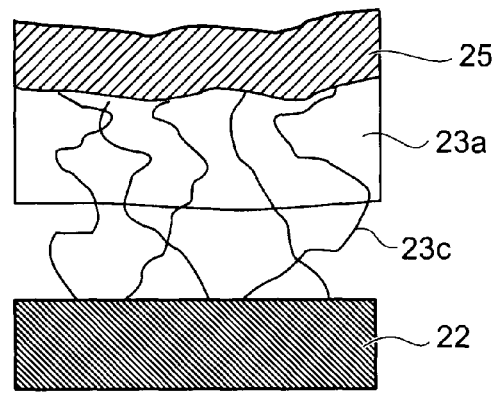
FIGS. 18A and 18B illustrate manufacturing processes of the memory cell portion of the nonvolatile memory device according to the fourth embodiment.

Then, as illustrated in FIG. 18A, the metal film 25 is formed on the CNT dispersion layer 28. Thereby, the CNTs 23c exposed from the insulator 23a contact the metal film 25. At this stage, the surface of the metal film 25 is uneven to reflect the uneven configuration of the surface of the CNT dispersion layer 27 after the etch-back.

Although FIG. 18A illustrates the form in which the one end of the at least one carbon nanotube 23c of the multiple carbon nanotubes 23c contacts the metal film 22 and the one other end is electrically connected to the metal film 25, the form in which a bent portion of the carbon nanotube 23c contacts the metal film 22 or the metal film 25 also is included in the embodiment. Restated, the form in which one portion of the at least one carbon nanotube 23c of the multiple carbon nanotubes 23c contacts the metal film 22 and a portion other than the one portion is electrically connected to the metal film 25 also is included in the embodiment.

Figure 18B:
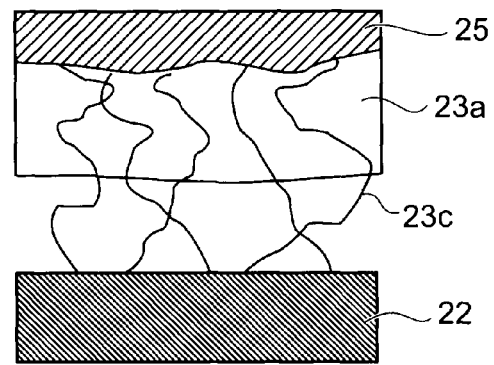

Then, as illustrated in FIG. 18B, the surface of the metal film 25 is planarized using CMP. Subsequently, as described using FIGS. 5A and 5B, the stopper interconnect film 26 is formed on the metal film 25 using sputtering or CVD. The subsequent processes are similar to those of the first example.

By such manufacturing processes, the CNT dispersion layer 28 in which the CNTs 23c are dispersed inside the insulator 23a may be formed.

Operations of the memory cell 80 formed using the method for manufacturing described above will now be described. In the description recited below, the memory cell 80 illustrated in FIG. 2B is described as an example.

Figures 19A, 19B:
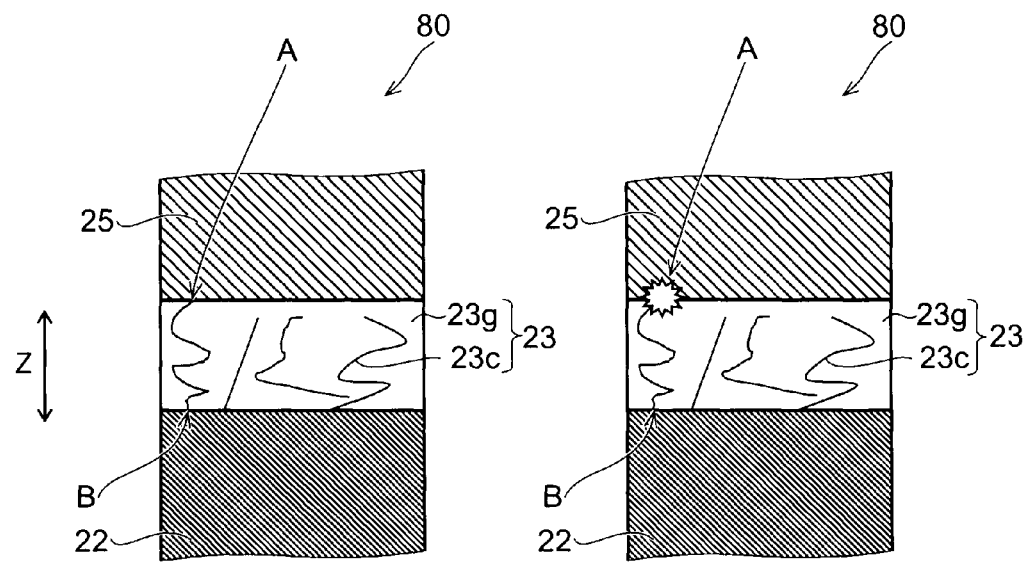
FIGS. 19A and 19B illustrate operations of the memory cell of the nonvolatile memory device.

FIGS. 19A and 19B illustrate the operations of the memory cell of the nonvolatile memory device.

First, in the initial state illustrated in FIG. 19A, one end of at least one carbon nanotube 23c of the multiple carbon nanotubes 23c contacts the metal film 22; and one other end is electrically connected to the metal film 25. These portions of contact are referred to as the portion A and the portion B.

In the case where the ends of the CNT 23c contact the metal film 22 and the metal film 25, the resistance between the metal film 22 and the metal film 25 is determined by the resistance of the contacting CNT 23c. The resistance at this time is taken as a first resistance.

Then, a reset operation of the first resistance is performed. Prior to the reset operation, one end of the CNT 23c contacts the metal film 22 at the portion B; and one other end of the CNT 23c contacts the metal film 25 at the portion A. Accordingly, when a first voltage is applied between the metal film 22 and the metal film 25, a current flows preferentially in the CNT 23c to link the portion A and the portion B.

When the current continuously flows for a prescribed amount of time (a time longer than the set time) in this state, for example, the CNT 23c proximal to the portion A breaks contact due to the heat generation due to the large current. This state is illustrated in FIG. 19B. Thereby, the resistance between the metal film 22 and the metal film 25 increases abruptly. The resistance at this time is taken as a second resistance. In other words, the resistance between the metal film 22 and the metal film 25 changes from a low resistance state to a high resistance state.

Continuing, when a set operation is performed on the memory cell 80, the resistance between the metal film 22 and the metal film 25 is changed from the high resistance state back to the low resistance state.

It is conceivable that this is because (1) the CNTs 23c having the once-broken contact extend to the metal film 25 and re-contact the metal film 25, (2) the CNTs 23c that broke contact and separated from each other now contact each other again due to Van der Waals forces, (3) other CNTs 23c start to conduct between the metal film 22 and the metal film 25, etc.

Other than the reasons described above, there are cases where the bonding states of the CNTs 23c that conduct the current transition reversibly between a first state and a second state. Here, the first state may be, for example, the $sp^2$ state of the carbon-carbon bond; and the second state may be, for example, the $sp^3$ state. Or, there are cases where an oxidation-reduction reaction repeatedly occurs at the interface between the CNT-containing layer 23 and the metal film in the operation of the memory cell 80. Thereby, the resistance of the CNT-containing layer 23 changes reversibly.

In the set operation, the CNTs 23c do not easily break contact because the voltage is applied for a time shorter than the reset operation. By setting the first state to be information of "0" and the second state to be information of "1," information can be repeatedly programmed to and erased from the memory cell 80.

Thus, in the memory cell 80, the CNT-containing layer 23 itself contributes to the switching of the memory (the programming and the erasing of information) by the CNTs 23c changing reversibly between the first state and the second state.

Actually, there are also cases where the CNTs 23c dispersed inside the insulator 23a entangle with each other. Accordingly, the current path between the metal film 22 and the metal film 25 is not limited to one CNT 23c. For example, there are cases where a current path is formed from a CNT 23c contacting the metal film 25 at the portion A through one other CNT contacting the CNT 23c to the metal film 22 by the one other CNT being in contact with the metal film 22.

However, in such a case as well, the CNT 23c still contacts the metal film 25 at the pinpoint of the portion A on the metal film 25 side. Thereby, the operations described above are possible.

Hereinabove, the embodiment is described with reference to specific examples. However, the embodiment is not limited to these specific examples. In other words, appropriate design modifications made by one skilled in the art to these specific examples also are within the scope of the embodiment to the extent that the features of the embodiment are included. For example, the components included in the specific examples described above and the dispositions, materials, conditions, configurations, sizes, etc., thereof are not limited to those illustrated and may be modified appropriately.

For example, the nonvolatile memory device of the embodiment is not limited to a so-called cross-point type in which the memory cell is connected at a location where two interconnects intersect. For example, a so-called probe memory type in which probes are brought into contact with multiple memory cells to execute the programming and the reading and a memory in which the memory cell is selected by a switching element such as a transistor to execute the programming and the reading also are included in the scope of the embodiment.

The components included in the embodiments described above can be used in combinations within the extent of technical feasibility. Such combinations also are included in the scope of the embodiment to the extent that the features of the embodiment are included.

Furthermore, various modifications and alterations within the spirit of the embodiment will be readily apparent to those skilled in the art. All such modifications and alterations should therefore be seen as within the scope of the embodiment.

For example, a form in which the diode layer is removed from the memory cell as necessary also is included in the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a nonvolatile memory device, the nonvolatile memory device including a memory cell connected to a first interconnect and a second interconnect, the method comprising:
    forming a first electrode film on the first interconnect;
    forming a layer including a plurality of carbon nanotubes dispersed inside an insulator on the first electrode film, at least one carbon nanotube of the plurality of carbon nanotubes being exposed from a surface of the insulator;
    forming a second electrode film on the layer; and
    forming the second interconnect on the second electrode film;
    the forming of the layer including heating a fluid including the plurality of carbon nanotubes after the fluid is placed on the first electrode film; and
    a solvent of the fluid being silanol ($Si(OH)_4$)-containing solvent or methylsilsesquioxane (MSQ)-containing solvent.

2. The method according to claim 1, wherein one portion of the at least one carbon nanotube of the plurality of carbon nanotubes is exposed by removing the surface of the insulator.

3. The method according to claim 1, wherein the forming of the layer includes impregnating the insulator into the plurality of carbon nanotubes after placing the plurality of carbon nanotubes on the first electrode film.

4. The method according to claim 1, wherein one portion of the at least one carbon nanotube of the plurality of carbon nanotubes exposed from the surface of the insulator is removed to make a thickness of the carbon nanotube from the surface of the insulator to be less than a thickness of the second electrode film by the thickness of the carbon nanotube from the surface of the insulator being not less than the thickness of the second electrode film prior to the forming of the layer.

5. The method according to claim 1, wherein the at least one carbon nanotube of the plurality of carbon nanotubes is exposed from the surface of the insulator by removing the surface of the insulator by the plurality of carbon nanotubes being covered with the insulator prior to the forming of the layer.

6. The method according to claim 1, wherein one portion of the plurality of carbon nanotubes dispersed inside the insulator and the surface of the insulator are removed to make a height of the plurality of carbon nanotubes from a surface of the first electrode film to be substantially the same as a height of the insulator from the surface of the first electrode film by the one portion of the plurality of carbon nanotubes being selectively exposed from the surface of the insulator prior to the forming of the layer.

7. The method according to claim 1, wherein one portion of the carbon nanotube is caused to protrude from the surface of the insulator, and the second electrode film is formed on the insulator with the protruding one portion being inserted into the second electrode film.

8. The method according to claim 1, wherein a gap is formed between the first electrode film and the second electrode film by removing the insulator.

9. The method according to claim 1, wherein a surface of the second electrode film is planarized after the forming of the second electrode film on the layer.

10. The method according to claim 1, wherein the layer exists between the first interconnect and the second interconnect crossing each other.

11. The method according to claim 1, wherein one end of at least one carbon nanotube of the plurality of carbon nanotubes contacts the first electrode film and one other end is electrically connected to the second electrode film in the layer.

12. The method according to claim 1, wherein a bent portion of the carbon nanotube contacts the first electrode film or the second electrode film.

13. The method according to claim 1, wherein the carbon nanotube is a single-walled nanotube having a single layer.

14. The method according to claim 1, wherein the carbon nanotube is a multi-walled nanotube having multiple layers.

15. The method according to claim 1, wherein the insulator is at least one of silicon oxide ($SiO_2$), alumina ($Al_2O_3$), silicon oxide-carbon (SiOC), magnesium oxide (MgO), an organic insulator, and polymethylsilsesquioxane (PMSQ).

16. The method according to claim 3, wherein a solution is coated onto the first electrode film, the plurality of carbon nanotubes being dispersed in the solution.

17. The method according to claim 1, wherein a specific gravity of the carbon nanotubes inside the fluid is greater than a specific gravity of a solvent of the fluid.

18. A method for manufacturing a nonvolatile memory device, the nonvolatile memory device including a memory cell connected to a first interconnect and a second interconnect, the method comprising:
- forming a first electrode film on the first interconnect;
- forming a layer including a plurality of carbon nanotubes dispersed inside an insulator on the first electrode film, at least one carbon nanotube of the plurality of carbon nanotubes being exposed from a surface of the insulator;
- forming a second electrode film on the layer; and
- forming a second interconnect on the second electrode film;
- the forming of the layer including heating a fluid including the plurality of carbon nanotubes after the fluid is placed on the first electrode film; and
- the fluid being water or alcohol containing the plurality of carbon nanotubes and fine particles of the insulator.

19. The method according to claim 18, wherein one portion of the at least one carbon nanotube of the plurality of carbon nanotubes is exposed by removing the surface of the insulator.

20. The method according to claim 18, wherein the forming of the layer includes impregnating the insulator into the plurality of carbon nanotubes after placing the plurality of carbon nanotubes on the first electrode film.

21. The method according to claim 18, wherein one portion of the at least one carbon nanotube of the plurality of carbon nanotubes exposed from the surface of the insulator is removed to make a thickness of the carbon nanotube from the surface of the insulator to be less than a thickness of the second electrode film by the thickness of the carbon nanotube from the surface of the insulator being not less than the thickness of the second electrode film prior to the forming of the layer.

22. The method according to claim 18, wherein the at least one carbon nanotube of the plurality of carbon nanotubes is exposed from the surface of the insulator by removing the surface of the insulator by the plurality of carbon nanotubes being covered with the insulator prior to the forming of the layer.

23. The method according to claim 18, wherein one portion of the plurality of carbon nanotubes dispersed inside the insulator and the surface of the insulator are removed to make a height of the plurality of carbon nanotubes from a surface of the first electrode film to be substantially the same as a height of the insulator from the surface of the first electrode film by the one portion of the plurality of carbon nanotubes being selectively exposed from the surface of the insulator prior to the forming of the layer.

24. The method according to claim 18, wherein one portion of the carbon nanotube is caused to protrude from the surface of the insulator, and the second electrode film is formed on the insulator with the protruding one portion being inserted into the second electrode film.

25. The method according to claim 18, wherein a gap is formed between the first electrode film and the second electrode film by removing the insulator.

26. The method according to claim 18, wherein a surface of the second electrode film is planarized after the forming of the second electrode film on the layer.

27. The method according to claim 18, wherein the layer exists between the first interconnect and the second interconnect crossing each other.

28. The method according to claim 18, wherein one end of at least one carbon nanotube of the plurality of carbon nanotubes contacts the first electrode film and one other end is electrically connected to the second electrode film in the layer.

29. The method according to claim 18, wherein a bent portion of the carbon nanotube contacts the first electrode film or the second electrode film.

30. The method according to claim 18, wherein the carbon nanotube is a single-walled nanotube having a single layer.

31. The method according to claim 18, wherein the carbon nanotube is a multi-walled nanotube having multiple layers.

32. The method according to claim 18, wherein the insulator is at least one of silicon oxide ($SiO_2$), alumina ($Al_2O_3$), silicon oxide-carbon (SiOC), magnesium oxide (MgO), an organic insulator, and polymethylsilsesquioxane (PMSQ).

33. The method according to claim 20, wherein a solution is coated onto the first electrode film, the plurality of carbon nanotubes being dispersed in the solution.

34. The method according to claim 18, wherein a specific gravity of the carbon nanotubes inside the fluid is greater than a specific gravity of a solvent of the fluid.

\* \* \* \* \*